(12) United States Patent
Sakaguchi et al.

(10) Patent No.: US 7,282,943 B2
(45) Date of Patent: Oct. 16, 2007

(54) INSPECTION DEVICE FOR INSPECTING TFT

(75) Inventors: Yoshitami Sakaguchi, Hadano (JP); Daiju Nakanao, Sagamiham (JP); Kenichi Imura, Shiga-ken (JP); Yoshinori Mekata, Moriyama (JP); Tomoyuki Taguchi, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/970,555

(22) Filed: Oct. 21, 2004

(65) Prior Publication Data

US 2005/0104614 A1   May 19, 2005

(30) Foreign Application Priority Data

Nov. 13, 2003   (JP) .............................. 2003-383522

(51) Int. Cl.
*G01R 31/00*   (2006.01)
*G01R 31/28*   (2006.01)
*G09G 5/00*   (2006.01)

(52) U.S. Cl. ...................................... 324/770; 345/213

(58) Field of Classification Search ................ 324/770

See application file for complete search history.

(56) References Cited

U.S. PATENT DOCUMENTS

| 6,784,880 B2 * | 8/2004 | Fujita et al. ................. 345/213 |
| 7,053,645 B2 * | 5/2006 | Chung ......................... 324/764 |
| 2002/0121917 A1 * | 9/2002 | Murakawa et al. .......... 324/770 |

FOREIGN PATENT DOCUMENTS

| JP | 62-217169 | * 9/1987 |
| JP | 04-329332 | * 11/1992 |
| JP | 2002-108243 | 10/2002 |
| JP | 2002-72918 | 12/2002 |

* cited by examiner

*Primary Examiner*—Ha Tran Nguyen
*Assistant Examiner*—Emily Y Chan
(74) *Attorney, Agent, or Firm*—Gibb & Rahman, LLC

(57) ABSTRACT

Provided is an inspection device which inspects a thin film transistor (TFT) for supplying a current to a light emitting element. The inspection device includes: a first current supply circuit which supplies a drain current between a drain and a source of the TFT; a gate voltage adjustment circuit which adjust a gate voltage to be applied to a gate of the TFT so as to allow a predetermined specified current to flow between the drain and source of the TFT; and a measurement unit which measures the gate voltage adjusted by the gate voltage adjustment circuit.

9 Claims, 17 Drawing Sheets

| PIXEL ELECTRODE POTENTIAL [V] | SPECIFIED CURRENT (Ic) [μA] | Vout (Vd) [V] | Vc [V] | Rc [kΩ] | Vg AVERAGE [V] | Vs AVERAGE [V] | Vth [V] | $\beta$ [μA/V$^2$] |
|---|---|---|---|---|---|---|---|---|
| 0.5±2 | 2 | 10 | 11 | 500 | 3.39 | 0.5 | 1.40 | 2.04 |
| 0.5±2 | 4 | 10 | 12 | 500 | 3.97 | 0.5 | | |

| PIXEL ELECTRODE POTENTIAL [V] | MEASURED CURRENT AVERAGE (Id) [μA] | Vd [V] | Vg [V] | Vg AVERAGE [V] | Vth [V] | β [μA/V²] |
|---|---|---|---|---|---|---|
| 0.5±2 | 2.80 | 10 | 3.0 | 0.5 | 0.76 | 1.13 |
| 0.5±2 | 4.20 | 10 | 3.5 | 0.5 | | |

| PIXEL ELECTRODE POTENTIAL [V] | Vofs [V] | Vout (Vd) [V] | Vc AVERAGE [V] | Rc [kΩ] | DRAIN CURRENT AVERAGE (Ic) [μA] | Vg [V] | Vs AVERAGE [V] | Vth [V] | β [μA/V²] |
|---|---|---|---|---|---|---|---|---|---|
| 0.5±2 | 2.5 | 5.5 | 9.54 | 100 | 40.4 | 8 | 0.5 | 1.48 | 2.04 |
| 0.5±2 | 3.5 | 4.5 | 8.23 | 100 | 37.3 | 8 | 0.5 | | |

Fig. 16 (a)

| CONTACT RESISTANCE [kΩ] | SPECIFIED CURRENT (Ic) [μA] | Vout (Vd) [V] | Vc [V] | Rc [kΩ] | Vg [V] | Vs [V] | Vth [V] | β [μA/V²] |
|---|---|---|---|---|---|---|---|---|
| 1 | 2 | 10 | 11 | 500 | 2.892 | 0.002 | 1.49 | 2.04 |
|  | 4 | 10 | 12 | 500 | 3.470 | 0.004 |  |  |
|  | 6 | 10 | 13 | 500 | 3.913 | 0.006 |  |  |
| 5 | 2 | 10 | 11 | 500 | 2.900 | 0.010 | 1.49 | 2.04 |
|  | 4 | 10 | 12 | 500 | 3.486 | 0.020 |  |  |
|  | 6 | 10 | 13 | 500 | 3.937 | 0.030 |  |  |
| 50 | 2 | 10 | 11 | 500 | 2.990 | 0.100 | 1.49 | 2.04 |
|  | 4 | 10 | 12 | 500 | 3.666 | 0.200 |  |  |
|  | 6 | 10 | 13 | 500 | 4.207 | 0.300 |  |  |

Fig. 16 (b)

| CONTACT RESISTANCE [kΩ] | SET CURRENT (Id) [μA] | Vd [V] | Vg [V] | Vs [V] | Vth [V] | β [μA/V²] |
|---|---|---|---|---|---|---|
| 1 | 2.32 | 10 | 3.0 | 0.002 | 1.50 | 2.07 |
|  | 4.13 | 10 | 3.5 | 0.004 |  |  |
| 5 | 2.30 | 10 | 3.0 | 0.011 | 1.48 | 1.98 |
|  | 4.06 | 10 | 3.5 | 0.020 |  |  |
| 50 | 2.03 | 10 | 3.0 | 0.101 | 1.36 | 1.52 |
|  | 3.46 | 10 | 3.5 | 0.173 |  |  |

INSPECTION DEVICE FOR INSPECTING TFT

BACKGROUND OF THE INVENTION

The present invention relates to an inspection device which inspects thin-film transistors (TFTs). The present invention particularly relates to an inspection device which inspects the characteristics of TFTs for supplying a current to respective pixels included in a display device.

In recent years, organic electroluminescence displays (organic EL displays), which include organic light emitting diodes (OLEDs) as pixels, have been receiving attention as a display device capable of bright display at low power. For the achievement of efficient volume production of the organic EL display, it is important to reduce the manufacturing costs and to enhance the yield by detecting and removing defectives in as early a manufacturing step as possible.

Conventionally, there have been proposed techniques to detect a defective TFT array for supplying a current to OLEDs (see Patent Documents 1 and 2). In these techniques, the characteristic of each TFT is inspected prior to a process of forming OLEDs on a TFT array. Thus, in comparison with a case of detecting a defective after OLEDs are formed on a TFT array, it is possible to avoid wasting the process of forming OLEDs and the materials of the OLEDs and thereby to reduce the manufacturing costs.

For example, FIGS. 17(a) and 17(b) each show processes through which an organic EL display panel with OLEDs is manufactured. As shown in FIG. 17(a), when inspection is performed after a cell process for forming OLEDs on a TFT array, the OLEDs have to be formed on a defective TFT array, which is wasteful. On the other hand, as shown in FIG. 17(b), if inspection can be performed prior to the cell process, it is possible to reduce the wastes involved in the cell process.

More specifically, in the technique in Patent Document 1, a common electrode is connected with each TFT in a TFT array prior to a process of patterning on the TFT array pixel electrodes to be connected with OLEDs. A power supply is then connected with the common electrode, and a current flowing in each TFT is measured. Moreover, in the technique in Patent Document 2, pixel electrodes in a TFT array are energized by dipping the TFT array in an electrolytic liquid, and then a current flowing in each TFT is measured.

[Patent Document 1] Japanese Unexamined Patent Publication No. 2002-108243

[Patent Document 2] Japanese Unexamined Patent Publication No. 2002-72918

However, in the manufacture of an organic EL display by the technique in the above Patent Document 1, a process of stripping the common electrode and patterning the pixel electrodes to be connected with the OLEDs is required after the inspection of the TFT array. That is, it can hardly be said that the inspection is performed after the TFT array is finished. Therefore, it can be thought that a defect may occur after the inspection.

According to the technique in the above Patent Document 2, since it is difficult to accurately measure a voltage applied to each TFT, there is a problem that an error in the inspection result may be large. Moreover, there are some occasions where the TFT array dipped in the electrolyte may suffer damage such as breakage and dissolution.

In addition, both the above techniques adopt a measurement method in which a given voltage is applied between a drain and a source of a TFT and then a drain current is measured. In order to realize this method, it is necessary to apply a desired voltage with a precise voltage value to each of the drain and source. In the inspection prior to the cell process, however, since one terminal of the drain and source is not connected with the circuit, it is difficult to apply a stable voltage to the terminal.

SUMMARY OF THE INVENTION

In this connection, an object of the present invention is to provide an inspection device which is capable of solving the above-described problems. This object will be achieved by combinations of features set forth in independent claims in the scope of claims. In addition, dependent claims define more advantageous specific examples of the present invention.

In order to solve the foregoing problems, a first aspect of the present invention provides an inspection device which inspects a thin film transistor (TFT) for supplying a current to a light emitting element, the inspection device including: a first current supply circuit which supplies a drain current between a drain and a source of the TFT; a gate voltage adjustment circuit which adjusts a gate voltage to be applied to a gate of the TFT so that a predetermined specified current flows between the drain and source of the TFT; and a measurement unit which measures the gate voltage adjusted by the gate voltage adjustment circuit.

Note that the above summary of the present invention does not cite all the necessary features of the present invention and that sub-combinations of groups of these features may constitute the invention.

According to the present invention, it is possible to enhance the precision with which the inspection of TFTs is performed.

BRIEF DESCRIPTION OF THE DRAWINGS

For a more complete understanding of the present invention and the advantages thereof, reference is now made to the following description taken in conjunction with the accompanying drawings.

FIG. 16(a) shows results of a simulation where the inspection device 10 shown in FIG. 11 inspects the TFT array 20, and FIG. 16(b) shows results of a simulation where, while pixel electrodes are in contact with conductive rubber or the like, the TFT array 20 is inspected using a conventional method.

DETAILED DESCRIPTION OF THE PREFERRED EMBODIMENT

Hereinafter, the present invention will be described through an embodiment of the invention. However, the under mentioned embodiment is not intended to limit the invention according to the scope of claims, and not all the combinations of features described in the embodiment are necessary for the solving means of the present invention.

Figure 1:
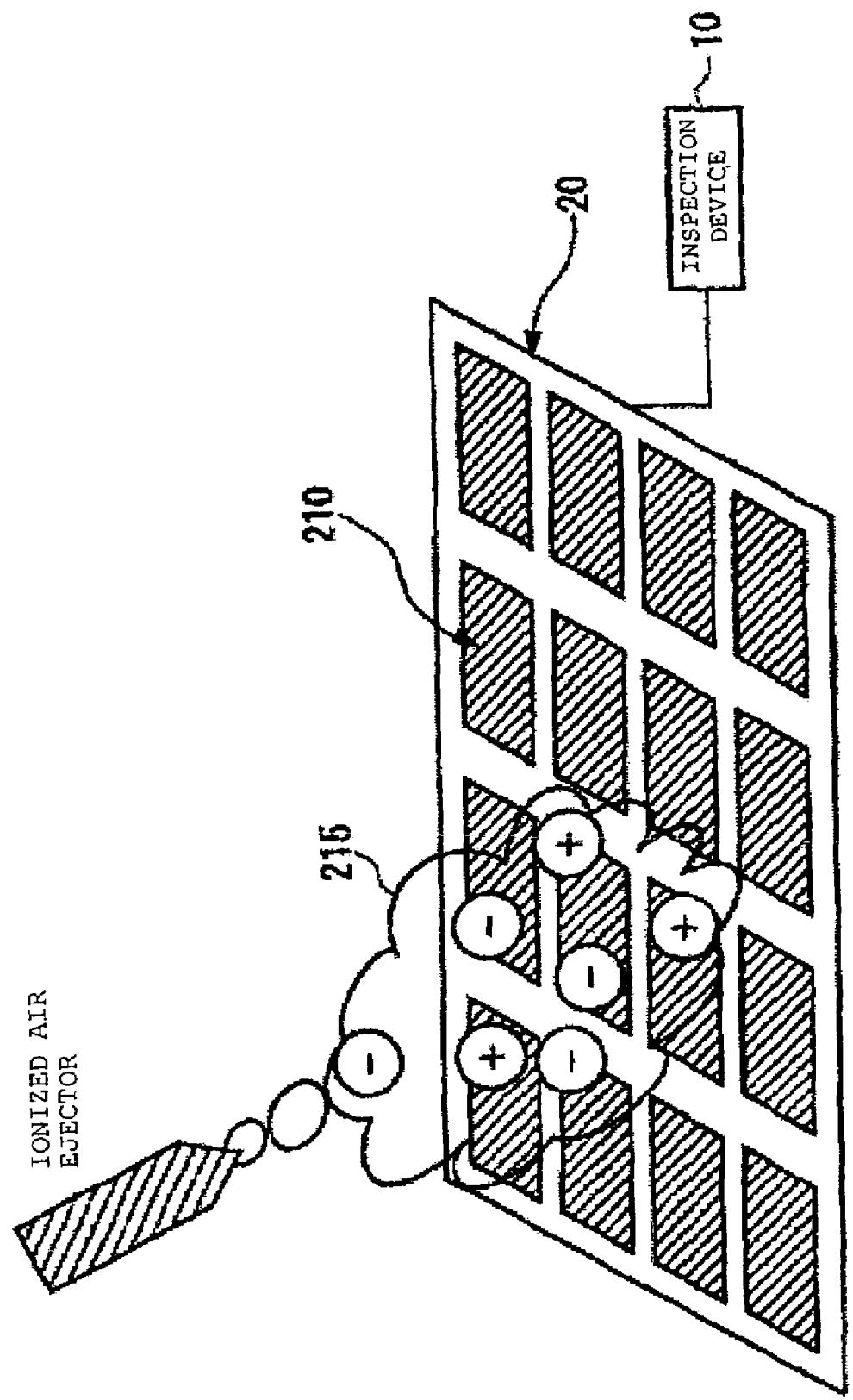
FIG. 1 schematically shows an inspection device 10 inspecting a TFT array 20.
Figure 2:
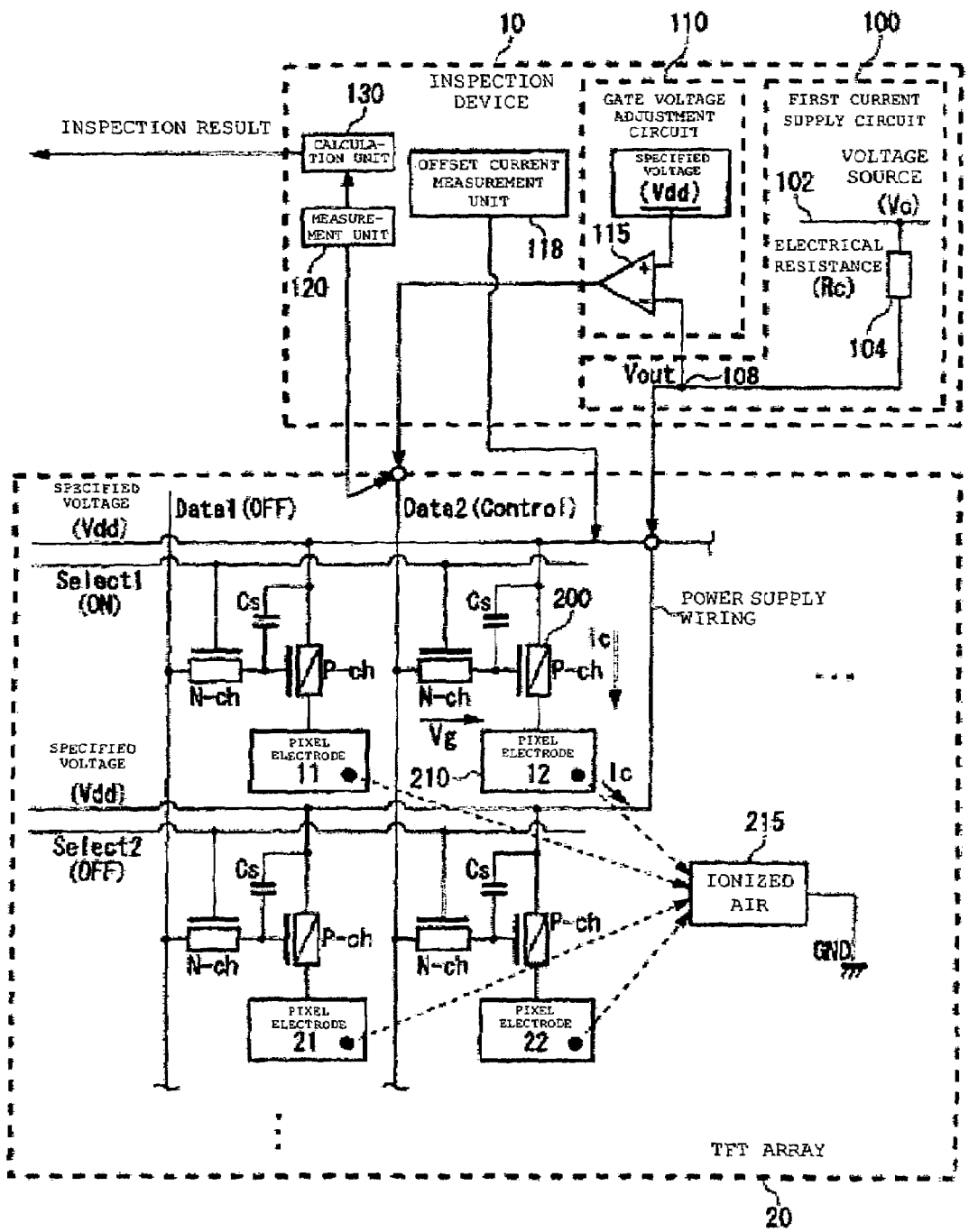
FIG. 2 shows a block diagram of the inspection device 10.

FIG. 1 schematically shows an inspection device 10 inspecting a TFT array 20. FIG. 2 shows a block diagram of the inspection device 10. An object of the inspection device 10 is to inspect the TFT array 20 that is a panel in which a plurality of TFTs for providing a current to light emitting elements such as organic light emitting diodes (OLEDs) are arrayed in matrix, and to determine whether the TFT array 20 is a defective or non-defective.

The TFT array 20 includes a plurality of data lines, select lines, and power supply wiring. The data line supplies gate voltage to be applied to each of a plurality of the TFTs arrayed in a single column. The select line selects a plurality of the TFTs to which the gate voltage supplied through the data line is to be applied. The power supply wiring supplies a current to drains or sources of a plurality of the TFTs in common. The inspection device 10 sequentially inspects the characteristic of each TFT included in the TFT array 20. In FIG. 2, however, for convenience, a description will be given of a case of inspecting the characteristic of a TFT 200 included in the TFT array 20.

TFT 200 is, for example, a P-channel MOS transistor. In accordance with the relationship between gate and drain voltages, the TFT 200 operates in a linear region where the drain current varies substantially linearly with voltages between the drain and source, or in a saturation region where the drain current varies less than in the linear region. In addition, only a select line for supplying voltage to the TFT 200 is turned on.

First, an ionized air ejector blows ionized air 215 onto a pixel electrode 210 where the TFT 200 is in contact with the light emitting element, thereby securing a path through which a current flows into the pixel electrode 210. As a result, one of the drain and source of the TFT 200, for instance, the drain in this example has a potential difference of an unknown and variable magnitude from a ground potential. Here, the ionized air can be generated by corona discharge, a soft X-ray, or the like. Instead of this, the path through which a current flows may be secured by irradiating an electron beam onto the pixel electrode 210 or by dipping the pixel electrode 210 into an electrolyte.

The inspection device 10 includes a first current supply circuit 100, a gate voltage adjustment circuit 110, a measurement unit 120, and a calculation unit 130. The first current supply circuit 100 applies such a voltage as to cause the TFT 200 to operate in the saturation region, through the power supply wiring, to the other one of the drain and source of the TFT 200, for instance, one which is not connected with the pixel electrode 210 (the source in the example in FIG. 2). Thus, the first current supply circuit 100 supplies a current between the drain and source of the TFT 200. As for a concrete circuit configuration of the first current supply circuit 100, it includes a voltage source 102, an electrical resistance 104, and an output terminal 108.

The voltage source 102 is set to a predetermined potential (Vc). The electrical resistance 104 has a resistance value (Rc) and is connected with the voltage source 102. The output terminal 108 is connected with the electrical resistance 104 and supplies a current flowing from the voltage source 102 through the electrical resistance 104, to the TFT 200 through the power supply wiring in the TFT array 20. The potential (Vc) of the voltage source 102 and the resistance value (Rc) of the electrical resistance 104 are adjusted such that the first current supply circuit 100 allows a predetermined specified current (Ic) to flow when the potential of the output terminal 108 is equal to a predetermined specified voltage (Vdd). That is, the potential (Vc) and the resistance value (Rc) are adjusted such that the following relationship is established.

Specified Current (Ic)=|Potential of Voltage Source (Vc)–Specified Voltage (Vdd)|/Resistance Value (Rc)

The gate voltage adjustment circuit 110 sequentially adjusts gate voltages to be applied to a gate of the TFT 200 so that at least two different specified currents flow between the drain and source of the TFT 200. Specifically, the gate voltage adjustment circuit 110 adjusts the gate voltage for each of the specified currents so that the drain current is reduced when the drain current supplied from the first current supply circuit 100 is larger than the specified current in question and so that the drain current is increased when the drain current supplied from the first current supply circuit 100 is smaller than the specified current in question.

As for a concrete circuit configuration of the gate voltage adjustment circuit 110, it includes an amplifier 115. The amplifier 115 receives an input of the potential of the output terminal 108 by the inverting input terminal and an input of the specified voltage (Vdd) by the non-inverting input terminal. When the potential of the output terminal 108 is different from the specified voltage (Vdd), the amplifier 115 applies such a gate voltage as to make the potential of the output terminal 108 equal to the specified voltage (Vdd), to the data line to the TFT 200.

An offset current measurement unit 118, prior to inspection and measurement, measures the magnitude of an offset current supplied from the first current supply circuit 100 to the power supply wiring in a state where all the TFTs in the TFT array 20 are not driven. When the measurement unit 120 measures the gate voltage, the offset current measurement unit 118 further supplies the offset current to the power supply wiring. An example of this will be described using FIG. 3.

Figure 3:
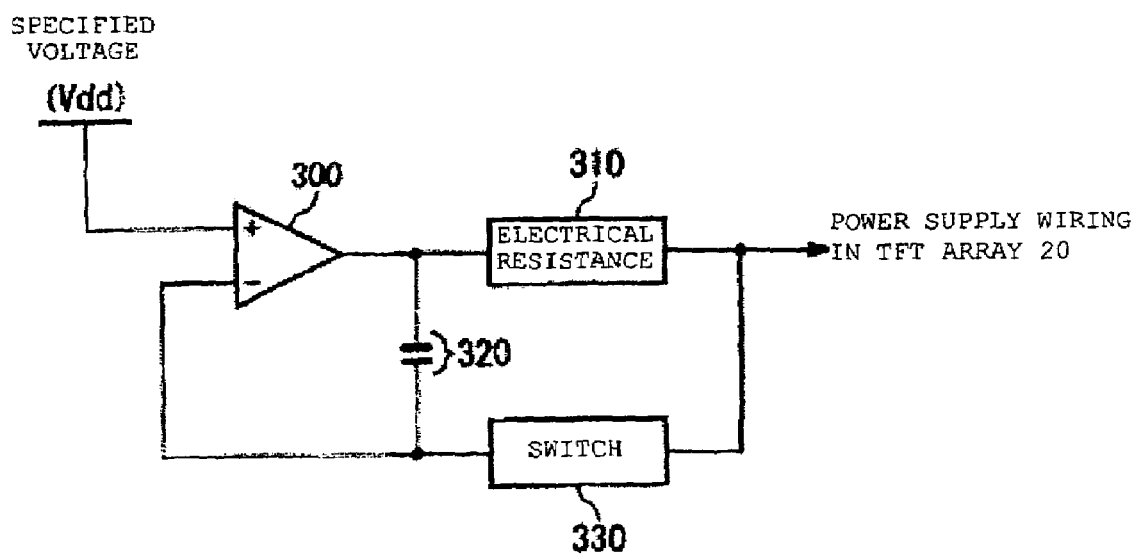
FIG. 3 shows an example of an offset current measurement unit 118.

FIG. 3 shows an example of the offset current measurement unit 118. The offset current measurement unit 118 includes an amplifier 300, an electrical resistance 310, a capacitor 320, and a switch 330. The amplifier 300 receives an input of the specified voltage (Vdd) at the non-inverting input terminal. An output terminal of the amplifier 300 is connected with one end of the electrical resistance 310 and with one end of the capacitor 320. The other end of the electrical resistance 310 is connected with the power supply wiring in the TFT array 20. The other end of the capacitor 320 is connected with the power supply wiring in the TFT array 20 via the switch 330 and also connected with an inverting input terminal of the amplifier 300.

First, prior to the inspection and measurement, the offset current measurement 118 turns on the switch 330 (that is, shorts both ends of the switch 330) in a state where all the TFTs in the TFT array 20 are not driven. As a result, the voltage of the power supply wiring becomes equal to the specified voltage (Vdd), and a potential difference which allows the offset current to flow in the power supply wiring is generated between both the ends of the electrical resistance 310. Thus, the offset current measurement unit 118 can charge the capacitor 320 with a voltage which can cause the offset current to flow in the power supply wiring when the voltage of the power supply wiring is equal to the specified voltage (Vdd) (this operation will be referred to as sampling operation).

Next, when the measurement unit 120 measures the gate voltage, the offset current measurement unit 118 turns off the switch 330. As a result, owing to the voltage charged in the capacitor 320 through the sampling operation, a potential difference which can cause the offset current to flow is generated between both the ends of the electrical resistance 310. Thus, the offset current measurement unit 118 can supply the offset current to the power supply wiring (this operation will be referred to as holding operation). As described above, according to the offset current measurement unit 118, even when a short circuit or the like exists due to a trouble in a circuit of the TFT array 20, it is possible to allow the first current supply circuit 100 to supply only a current necessary for the measurement of the gate voltage by supplying a current caused by the trouble to the TFT 200 through the holding operation.

Subsequently, the measurement unit 120 sequentially measures at least two gate voltages adjusted by the gate voltage adjustment circuit 110.

Figure 4:
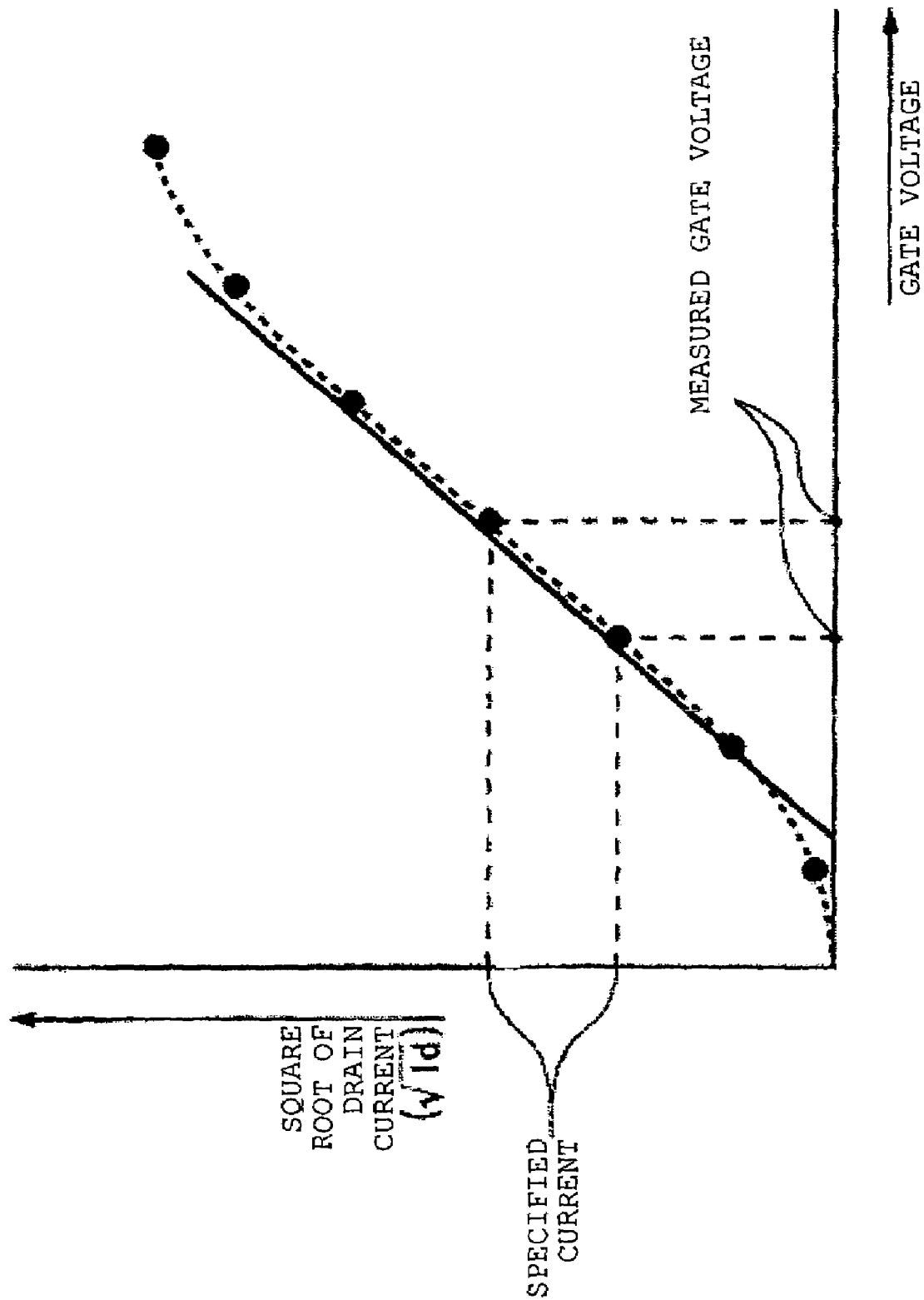
FIG. 4 shows an example of an Id-Vg curve of a TFT 200.

FIG. 4 shows an example of an Id-Vg curve of the TFT 200. Using this drawing, a description will be given of processing in which, based on the measurement results from the measurement unit 120, the calculation unit 130 calculates a value β that is a parameter indicating a current supply ability between the drain and source of a TFT.

First, a condition that the TFT 200 operates in the saturation region is expressed by the following expression (1).

[Expression 1]

$$Vds \geq (Vgs - Vth) \qquad (1)$$

Herein, Vds denotes a potential difference between the drain and source, Vgs denotes a potential difference between the gate and source, and Vth denotes a threshold voltage that is a threshold of the potential difference between the gate and source necessary to allow a current to flow between the drain and source. That is, the first current supply circuit 100 applies a voltage large enough to meet this condition, to the source of the TFT 200.

The characteristic of the TFT 200 in the saturation region can be approximated by the following expressions (2).

[Expression 2]

$$Id = \frac{1}{2}\beta(Vgs - Vth)^2 \qquad (2)$$

$$\beta = \frac{\mu \cdot Cox \cdot W}{L}$$

Herein, Id denotes a drain current. In FIG. 4, the drain current (Id) is the specified current (Ic).

Calculating a square root of the expressions (2) leads to the following expression (3).

[Expression 3]

$$\sqrt{Id} = \sqrt{\frac{\beta}{2}}(Vgs - Vth) \qquad (3)$$

FIG. 4 shows a graph of this expression (3). That is, in the TFT 200 operating in the saturation region, the square root of the drain current is proportional to the gate voltage. In addition, the gradient of the square root of the drain current with respect to the gate voltage is the square root of a half of the value β.

The calculation unit 130 first calculates a voltage between the gate and source by subtracting the specified voltage (Vdd), which is the source voltage, from each of the two measured gate voltages. The calculation unit 130 then substitutes at least two sets of the specified current and the calculated voltage between the gate and source, each into the expression (3). As a result, simultaneous equations are obtained in which the square root of a half of the value β and Vth are unknowns.

The calculation unit 130 can calculates the value β in such a manner that these simultaneous equations are solved to calculate the square root of a half of the value β and the calculation result is squared and then multiplied by 2. Along with this, the calculation unit 130 can calculates the threshold voltage Vth, which is the threshold of the potential difference between the gate and drain necessary to allow a current to flow between the drain and source.

In the following description, the method of calculating the value β shown through FIGS. 1 to 4 will be referred to as a basic sequence.

Figure 5:
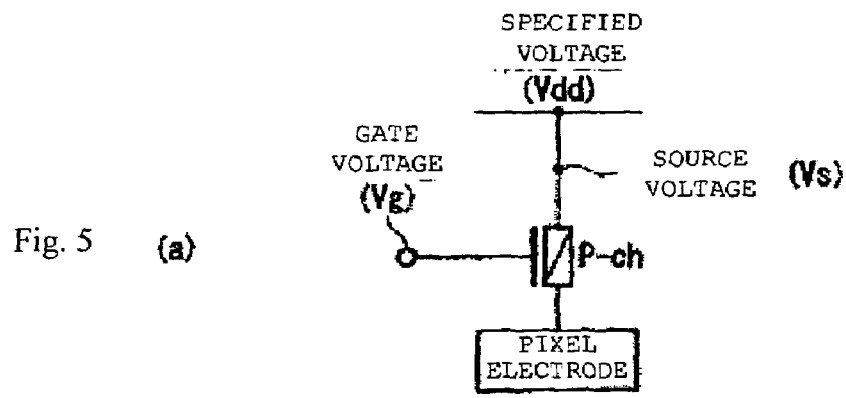
FIGS. 5(a) to 5(d) show layouts of a pixel electrode and a TFT.
Figure 5:
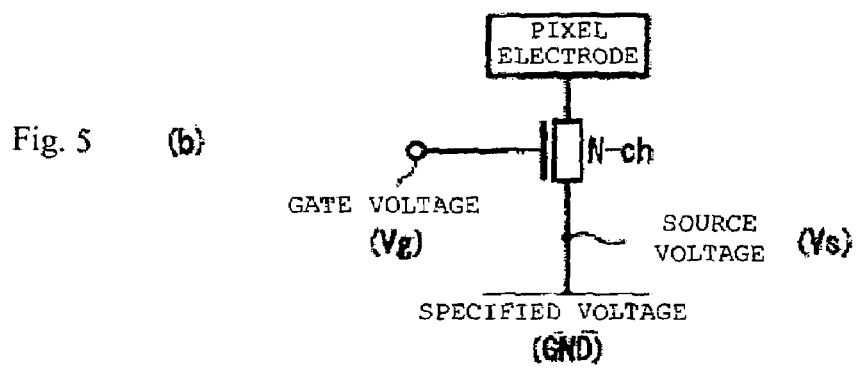
Figure 5:
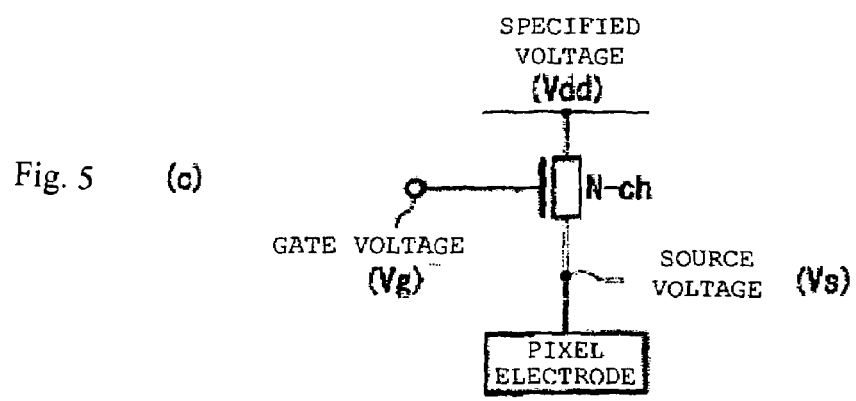
Figure 5:
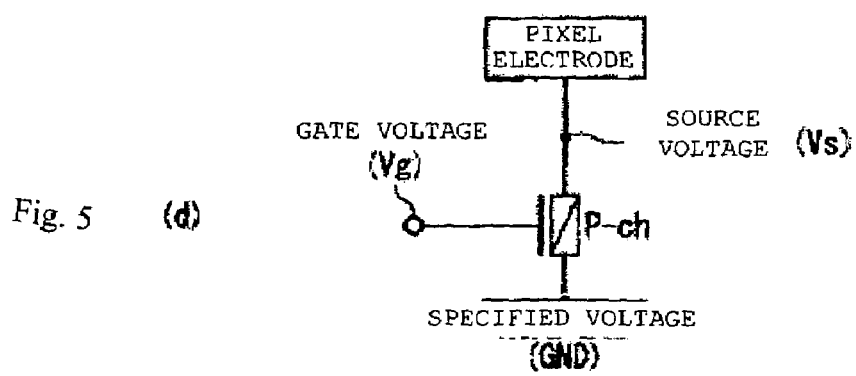

FIGS. 5(a) to 5(d) show layouts of a pixel electrode and a TFT. The layout of FIG. 5(a) is similar to that of the TFT described in FIG. 2. Apart from this layout, the TFT array 20 may adopt a mode shown in FIG. 5(b) as a layout of a pixel electrode and a TFT. In FIG. 5(b), the TFT array 20 includes an N-channel TFT in place of the P-channel TFT. Moreover, the drain of the N-channel TFT is connected with the pixel electrode. Furthermore, the source of the N-channel TFT is grounded.

Figure 6:
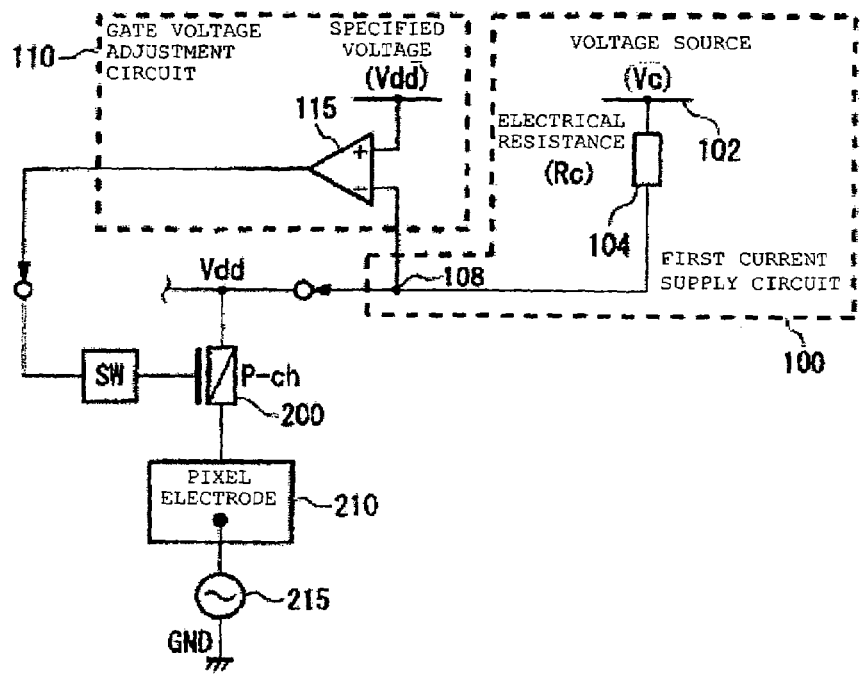
FIG. 6(a) shows an equivalent circuit to a circuit where the inspection device 10 inspects the TFT in FIG. 5(a)
FIG. 6(b) shows an equivalent circuit to a circuit where the inspection device 10 inspects the TFT in FIG. 5(b).
Figure 6:
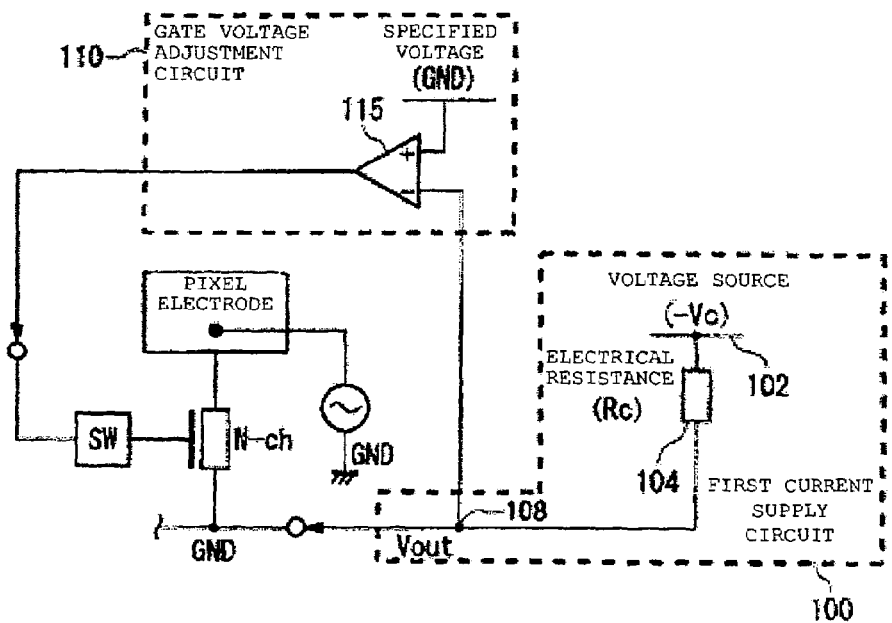

FIG. 6(a) shows an equivalent circuit to a circuit where the inspection device 10 inspects the TFT in FIG. 5(a). Since the equivalent circuit shown in FIG. 6(a) has substantially the same configuration as that of the circuit shown in FIG. 2, a description thereof will be omitted. FIG. 6(b) shows an equivalent circuit to a circuit where the inspection device 10 inspects the TFT in FIG. 5(b). In this drawing, a TFT for selecting a pixel is represented by SW for short.

In the example of FIG. 6(b), the first current supply circuit 100 applies a voltage to the source of the N-channel TFT, not of the P-channel TFT. Note that, in this drawing, the voltage applied by the first current supply circuit 100 is a negative voltage. In addition, a current supplied by the first current supply circuit 100 is a negative current. As in this case, the application of voltage in this embodiment includes a case of applying a negative voltage. Moreover, the supply of a current includes a case of supplying a negative current, in other words, a case of drawing out a current.

In addition, the voltage source 102 and the electrical resistance 104 included in the first current supply circuit 100 are adjusted such that the first current supply circuit 100 allows the specified current to flow when the output terminal 108 has a specified potential (for example, ground potential). The gate voltage adjustment circuit 110 adjusts the gate voltage so that the voltage to be applied by the first current supply circuit 100 becomes equal to the ground potential.

The measurement unit 120 sequentially measures the gate voltages adjusted by the gate voltage adjustment circuit 110, and based on the measured gate voltages, the calculation unit 130 calculates potential differences between the gate and source. The calculation unit 130 then calculates the value β and the threshold voltage (Vth) by using the aforementioned expression (3). As described above, since the source potential is known, the inspection device 10 can calculate not only the value β but the threshold voltage (Vth), also in the example of FIG. 6(b) similarly to the example of FIG. 6(a).

On the other hand, according to each of the layouts shown in FIGS. 5(c) and 5(d), since the source of a TFT is connected with a pixel electrode, the inspection device 10 cannot obtain a value of the source voltage. Therefore, the inspection device 10 can obtain values of the gate voltage and drain voltage but cannot calculate the potential difference between the gate and source.

Nevertheless, as will be described below, the inspection device 10 can calculate the value β even when the potential difference between the gate and source cannot be calculated. Moreover, the inspection device 10 can calculate the sum of the source voltage (Vs) and the threshold voltage (Vth).

Vgs can be expressed by (Vg−Vs) because Vgs is a potential difference between a gate voltage and a source voltage. Substituting this expression into the aforementioned expression (3) will yield the following expression (4). Further, transforming the expression (4) will lead to the expression (4)'.

[Expression 4]

$$\sqrt{Id} = \sqrt{\frac{\beta}{2}} (Vg - Vs - Vth) \quad (4)$$

$$\sqrt{Id} = \sqrt{\frac{\beta}{2}} (Vg - (Vs + Vth)) \quad (4)'$$

If two or more sets of Vg and Id are substituted into this expression (4)', the calculation unit 130 can calculate the value β as well as (Vs+Vth) that is the sum of the source voltage and the threshold voltage. Here, the sum of the source voltage and the threshold voltage is, namely, the threshold of a potential difference between a gate voltage and a ground potential, necessary to allow a current to flow between the drain and source of a TFT.

By repeating the processing described above for each of the TFTs in the TFT array 20, the calculation unit 130 can calculate at least the value β for each TFT, irrespective of the layouts of a TFT and a pixel electrode. Moreover, the calculation unit 130 can calculate the threshold voltage (Vth), depending on the layouts of a TFT and a pixel electrode. Based on the calculated values β and the like, for example, the calculation unit 130 executes the following processing.

For example, when the range of dispersion of the values β of the TFTs is wider than a predetermined reference, the calculation unit 130 may determine that the TFT array 20 in question is defective and may produce an output to that effect. As an example, when the value β of any of the TFTs in the same TFT array 20 is not within a predetermined range, the calculation unit 130 determines that the TFT array 20 in question is defective. Thus, it is possible to accurately inspect the TFT array 20 as to whether it is a defective or non-defective.

Instead, the calculation unit 130 may determine the dispersion of the values β of only a plurality of the TFTs which are arrayed a predetermined distance or more away from one another. Thus, it is possible to omit the inspection of the neighboring TFTs which are hard to exhibit a wide dispersion and thereby to reduce time and costs required for the inspection.

Moreover, based on (Vs+Vth), the sum of the source voltage and the threshold voltage of a TFT calculated for each of the TFTs included in the TFT array 20, the calculation unit 130 may determine the defectiveness of the TFT array 20. For example, when the range of dispersion of the thresholds for the TFTs is wider than a predetermined reference, the calculation unit 130 determines that the TFT array 20 in question is defective. In this case, even when the circuit configuration is such that the source voltages cannot be measured precisely, it is possible to properly determine the defectiveness of the TFT array 20 in question if it is known beforehand that the source voltages hardly vary from one TFT to another.

Next, a description will be given of a method of further calculating the threshold voltage Vth in the case of the layout shown in FIG. 5(c) or 5(d).

Figure 7:
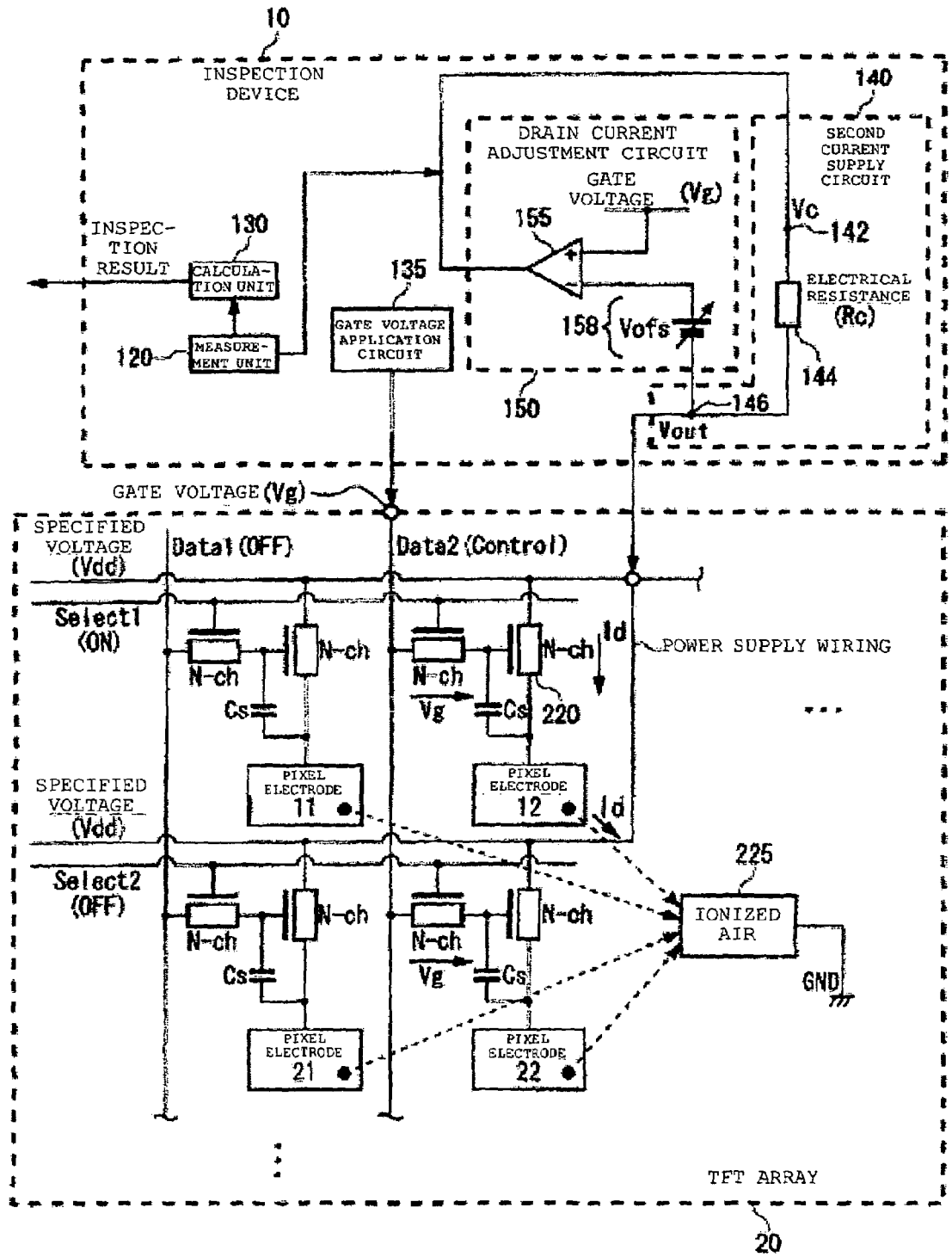
FIG. 7 shows a block diagram of an inspection device 10 which inspects a TFT array 20 in which source voltages are unknown.

FIG. 7 shows a block diagram of an inspection device 10 which inspects a TFT array 20 in which the source voltages are unknown. This drawing shows an example where the inspection device 10 calculates the value β and the threshold voltage Vth for a TFT in the layout shown in FIG. 5(c). Specifically, by being subjected to blowing ionized air 225, a pixel electrode connected with the source of a TFT 220 shown in this drawing has a potential difference of an unknown and variable magnitude from a ground potential.

The inspection device 10, in addition to the configuration shown in FIG. 2, further includes a gate voltage application circuit 135, a second current supply circuit 140, and a drain current adjustment circuit 150. The gate voltage application circuit 135 applies a predetermined gate voltage (Vg) to the gate of the TFT 220 through the data line. The second current supply circuit 140 supplies a drain current between the drain and source of the TFT 220 by applying a voltage to the drain of the TFT 220 through the power supply wiring. As for a concrete circuit configuration of the second current supply circuit 140, it includes an input terminal 142, an electrical resistance 144, and an output terminal 146. The input terminal 142 is connected with one end of the electrical resistance 144. The output terminal is connected with the other end of the electrical resistance 144 and supplies a current to the drain of the TFT 220 through the power supply wiring.

The drain current adjustment circuit 150 adjusts the drain current to be supplied by the second current supply circuit 140 so that a potential difference between a gate voltage and a drain voltage is equal to a preset set potential and that the TFT 220 is made to operate within the linear region. Thus, Vc is adjusted so that the potential Vout of the output terminal 146 is constant even when the source potential varies. As for a concrete circuit configuration of the drain current adjustment circuit 150, it includes a potential difference setting circuit 158 and an amplifier 155. The potential difference setting circuit 158 receives an input of the drain voltage and provides the amplifier 155 with an output of a voltage which is different from the inputted drain voltage by a set potential (Vofs), for example, a voltage which is higher than the drain voltage by the set potential (Vofs). Here, the set potential (Vofs) is set so as to be sufficiently larger than a predicted value of the threshold voltage (Vth). Thus, the TFT 200 will operate in the linear region.

The amplifier 155 receives an input of the output of the potential difference setting circuit 158 at an inverting input terminal and an input of the gate voltage (Vg) at a non-inverting input terminal. When the output voltage of the potential difference setting circuit 158 is different from the gate voltage, the amplifier 155 applies such a voltage as to make the output voltage of the potential difference setting circuit 158 equal to the gate voltage, to the input terminal 142 of the second current supply circuit 140. In addition, the drain current adjustment circuit 150 may share an amplifier with the gate voltage adjustment circuit 110 shown in FIG. 2, and may use the amplifier 115 which the gate voltage adjustment circuit 110 has, as the amplifier 155 by switching.

The measurement unit 120, in addition to the processing shown in FIG. 2, further sequentially measures the drain currents adjusted by the drain current adjustment circuit 150 for at least two different set potentials (Vofs). Specifically, the measurement unit 120 measures the voltage Vc applied to the input terminal 142 by the drain current adjustment circuit 150 and, based on the measured Vc, calculates the drain current. The calculation unit 130, in addition to the processing shown in FIG. 2, further calculates the threshold Vth of a potential difference between the gate and source of the TFT 220 necessary to allow a current to flow between the drain and source of the TFT 220, based on the drain currents sequentially measured by the measurement unit 120 and on the calculated value β. Concrete processing about this will be described below.

First, a condition that the TFT 220 operates in the linear region is expressed by the following expression (5).

[Expression 5]

$$Vds < (Vgs - Vth) \quad (5)$$

Herein, Vds denotes a potential difference between the drain and source, Vgs denotes a potential difference between the gate and source, and Vth denotes a threshold of a voltage between the gate and source necessary to allow a current to flow between the drain and source. That is, the gate voltage application circuit 135 and the second current supply circuit 140 apply a voltage which meets this condition to the drain or gate of the TFT 220.

Moreover, the characteristic of the TFT 220 in the linear region can be approximated by the following expressions (6).

[Expression 6]

$$Id = \frac{1}{2}\beta[2(Vgs - Vth) \cdot Vds - Vds^2] \quad (6)$$

$$\beta = \frac{\mu \cdot Cox \cdot W}{L}$$

The calculation unit 130 calculates the threshold Vth by using expressions (6)' obtained by transforming the expression (6).

[Expression 6']

$$Id_1 = \frac{1}{2}\beta[2(Vg_1 - Vs - Vth) \cdot (Vd_1 - Vs) - (Vd_1 - Vs)^2] \quad (6)'$$

$$Id_2 = \frac{1}{2}\beta[2(Vg_2 - Vs - Vth) \cdot (Vd_2 - Vs) - (Vd_2 - Vs)^2]$$

Herein, $Id_1$ and $Id_2$ denote drain currents sequentially measured by the measurement unit 120; $Vg_1$ and $Vd_1$ denote a gate voltage and a drain voltage, respectively, when $Id_1$ is measured; and $Vg_2$ and $Vd_2$ denote a gate voltage and a drain voltage, respectively, when $Id_2$ is measured.

In these expressions, unknowns are Vs, Vth and β. If the calculation unit 130 has already calculated the value β through the basic sequence, unknowns are Vs and Vth. Accordingly, the calculation unit 130 can calculate Vs and Vth by solving the simultaneous equations shown in the expressions (6)'.

Thus, as shown in FIG. 7, even when the source of a TFT is connected with the pixel electrode, the inspection device 10 can calculate the threshold voltage Vth, based on the value β calculated beforehand. In the following description, the method of calculating the threshold voltage by the processing shown in this drawing will be referred to as an extended sequence.

Figure 8:
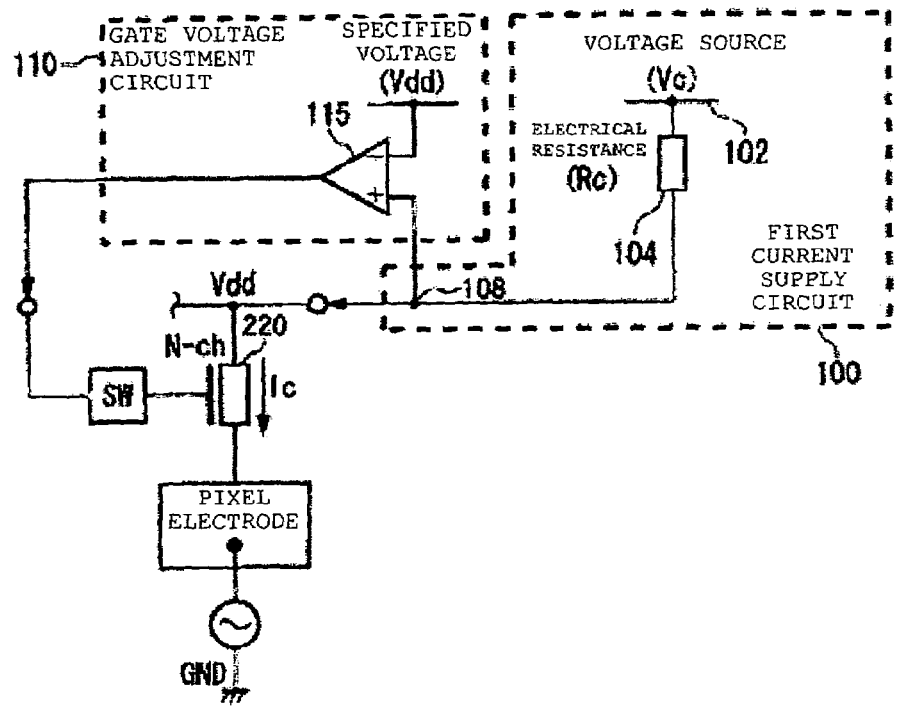
FIGS. 8(a) and 8(b) show equivalent circuits to a circuit where the inspection device 10 inspects the TFT in FIG. 5(c).
Figure 8:
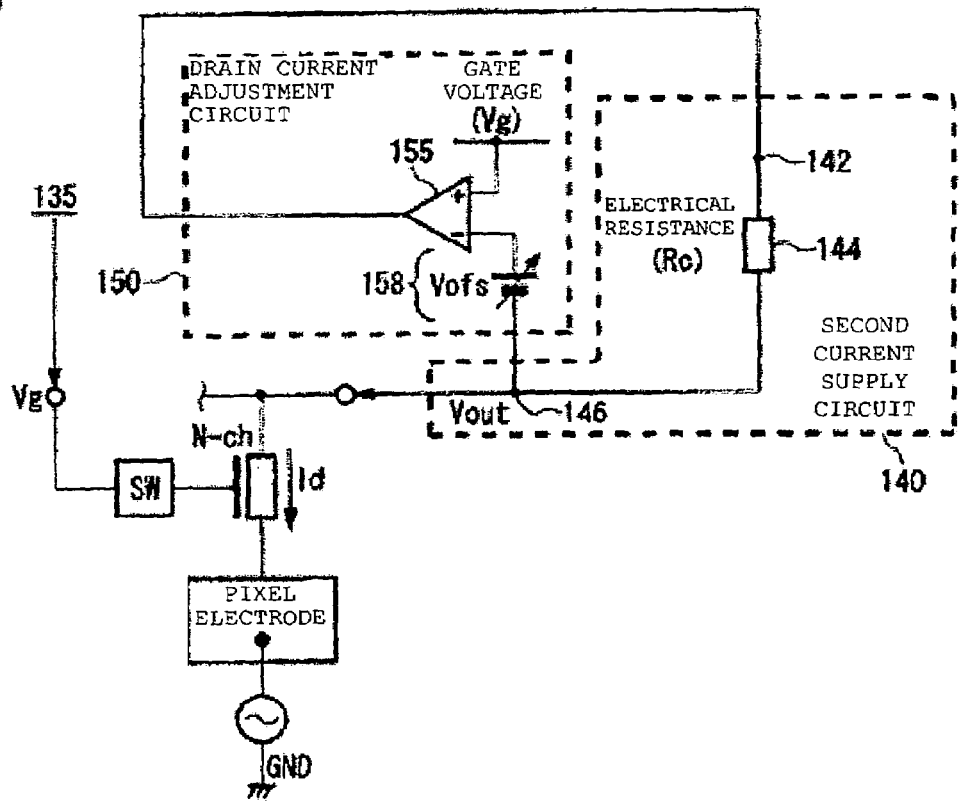

FIGS. 8(a) and 8(b) show equivalent circuits to a circuit where the inspection device 10 inspects the TFT shown in FIG. 5(c). In these drawings, a TFT for selecting a pixel is represented by SW for short. FIG. 8(a) shows a configuration of the circuit where the inspection device 10 calculates the value β of the TFT through the basic sequence. Due to ionized air or the like, the source of the TFT 220 has a potential difference of an unknown and variable magnitude from a ground potential. The first current supply circuit 100 supplies a current between the drain and source of the TFT 220 by applying, to the drain of the TFT 220, such a voltage as to allow the N-channel TFT 220 to operate in the saturation region. Since a concrete circuit configuration of the first current supply circuit 100 is substantially the same as that of the first current supply circuit 100 shown in FIG. 2, a description thereof will be omitted.

The gate voltage adjustment circuit 110 sequentially adjusts gate voltages to be applied to the TFT 220 so that at least two different specified currents flow between the drain and source of the TFT 220. As for a concrete circuit configuration of this gate voltage adjustment circuit 110, it is different from the gate voltage adjustment circuit 110 shown in FIG. 2 in that the amplifier 115 of this gate voltage adjustment circuit 110 receives an input of the specified voltage at the inverting input terminal and an input of a potential of the output terminal at the non-inverting input terminal. Since the other points are substantially the same as those of the gate voltage adjustment circuit 110 shown in FIG. 2, a description thereof will be omitted. The measurement unit 120 sequentially measures the gate voltages adjusted by the gate voltage adjustment circuit 110, and the calculation unit 130 calculates the value β by using the aforementioned expression (4)'.

FIG. 8(b) shows a configuration of the circuit where the inspection device 10 calculates the threshold voltage Vth of the TFT through the extended sequence. Since the configuration shown in this drawing is one illustrated as an equivalent circuit of the inspection device 10 shown in FIG. 7, a description thereof will be omitted. The calculation unit 130 can calculate the threshold voltage Vth by using the aforementioned expressions (6)', based on the value β calculated by the circuit of FIG. 8(a) and the drain currents measured by the circuit of FIG. 8(b).

Figure 9:
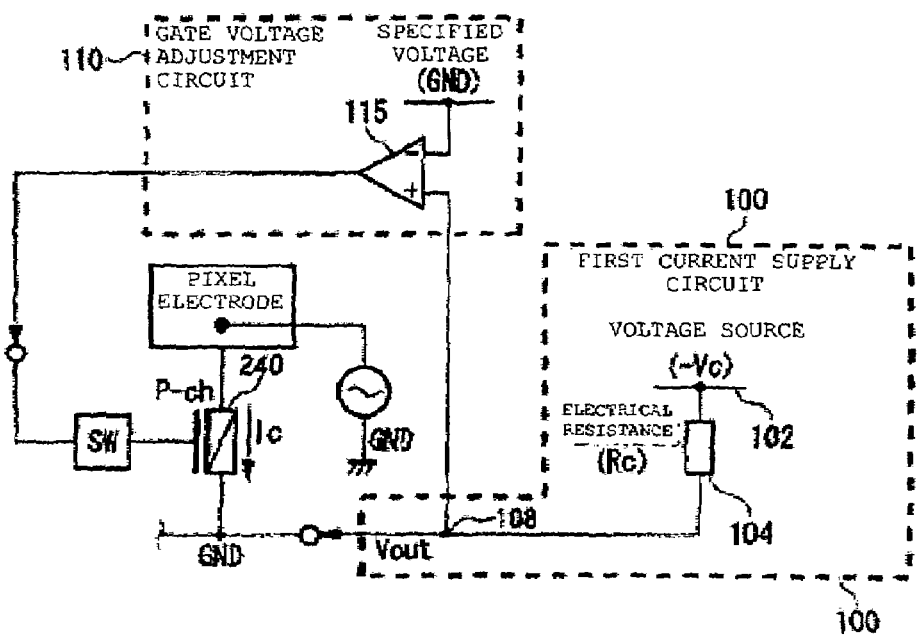
FIG. 9(a) shows an equivalent circuit to a circuit where the inspection device 10 inspects the TFT shown in FIG. 5(d) by using a basic sequence.
FIG. 9(b) shows a configuration of a circuit where the inspection device 10 calculates a threshold voltage Vth of the TFT by using an extended sequence.
Figure 9:
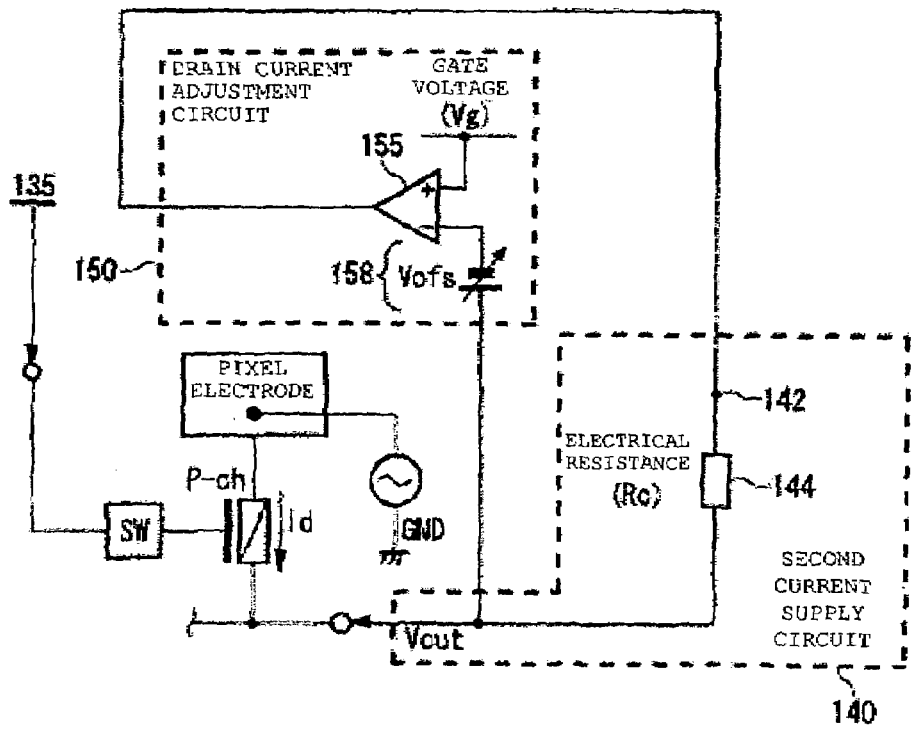

FIG. 9(a) shows an equivalent circuit to a circuit where the inspection device 10 inspects the TFT shown in FIG. 5(d) through the basic sequence. In this drawing, a TFT for selecting a pixel is represented by SW for short. A TFT 240 is a P-channel TFT, and due to ionized air or the like, the source of the TFT 240 has a potential difference of an unknown and variable magnitude from a ground potential.

The first current supply circuit 100 supplies a current between the drain and source of the TFT 240 by applying, to the drain of the TFT 240, such a voltage as to cause the TFT 240 to operate in the saturation region. Since a concrete circuit configuration of the first current supply circuit 100 is substantially the same as that of the first current supply circuit 100 shown in FIG. 2, a description thereof will be omitted.

The gate voltage adjustment circuit 110 sequentially adjusts gate voltages to be applied to the TFT 240 so that at least two different specified currents flow between the drain and source of the TFT 240. As for a concrete circuit configuration of this gate voltage adjustment circuit 110, it is different from the gate voltage adjustment circuit 110 shown in FIG. 2 in that the amplifier 115 of this gate voltage adjustment circuit 110 receives an input of the specified voltage at the inverting input terminal and an input of a potential of the output terminal 108 at the non-inverting input terminal. Since the other points are substantially the same as those of the gate voltage adjustment circuit 110 shown in FIG. 2, a description thereof will be omitted. The measurement unit 120 sequentially measures the gate voltages adjusted by the gate voltage adjustment circuit 110, and the calculation unit 130 calculates the value β by using the aforementioned expression (4)'.

FIG. 9(b) shows a configuration of a circuit where the inspection device 10 calculates the threshold voltage Vth of the TFT through the extended sequence. The gate voltage application circuit 135 applies a predetermined gate voltage (Vg) to the gate of the TFT 240. The second current supply circuit 140 supplies a drain current between the drain and source of the TFT 240 by applying a voltage to the drain of the TFT 240. Since a concrete circuit configuration of this second current supply circuit 140 is substantially the same as that of the second current supply circuit 140 shown in FIG. 7, a description thereof will be omitted.

The drain current adjustment circuit 150 adjusts the drain current to be supplied by the second current supply circuit 140 so that the gate voltage is different from the drain voltage by a preset set potential and that the TFT 240 is allowed to operate in the linear region. As for a concrete circuit configuration of this drain current adjustment circuit 150, it is different from the drain current adjustment circuit 150 shown in FIG. 7 in the following two points. First, the potential difference setting circuit 158 receives an input of the drain voltage and provides the amplifier 155 with a voltage which is lower than the inputted drain voltage by the set potential (Vofs). Moreover, The amplifier 155 receives an input of the output of the potential difference setting circuit 158 at the inverting input terminal and an input of the gate voltage (Vg) at the non-inverting input terminal.

The calculation unit 130 can calculate the threshold voltage Vth by using the aforementioned expressions (6)', based on the value β calculated by the circuit of FIG. 9(a) and the drain currents measured by the circuit of FIG. 9(b).

Figure 10:
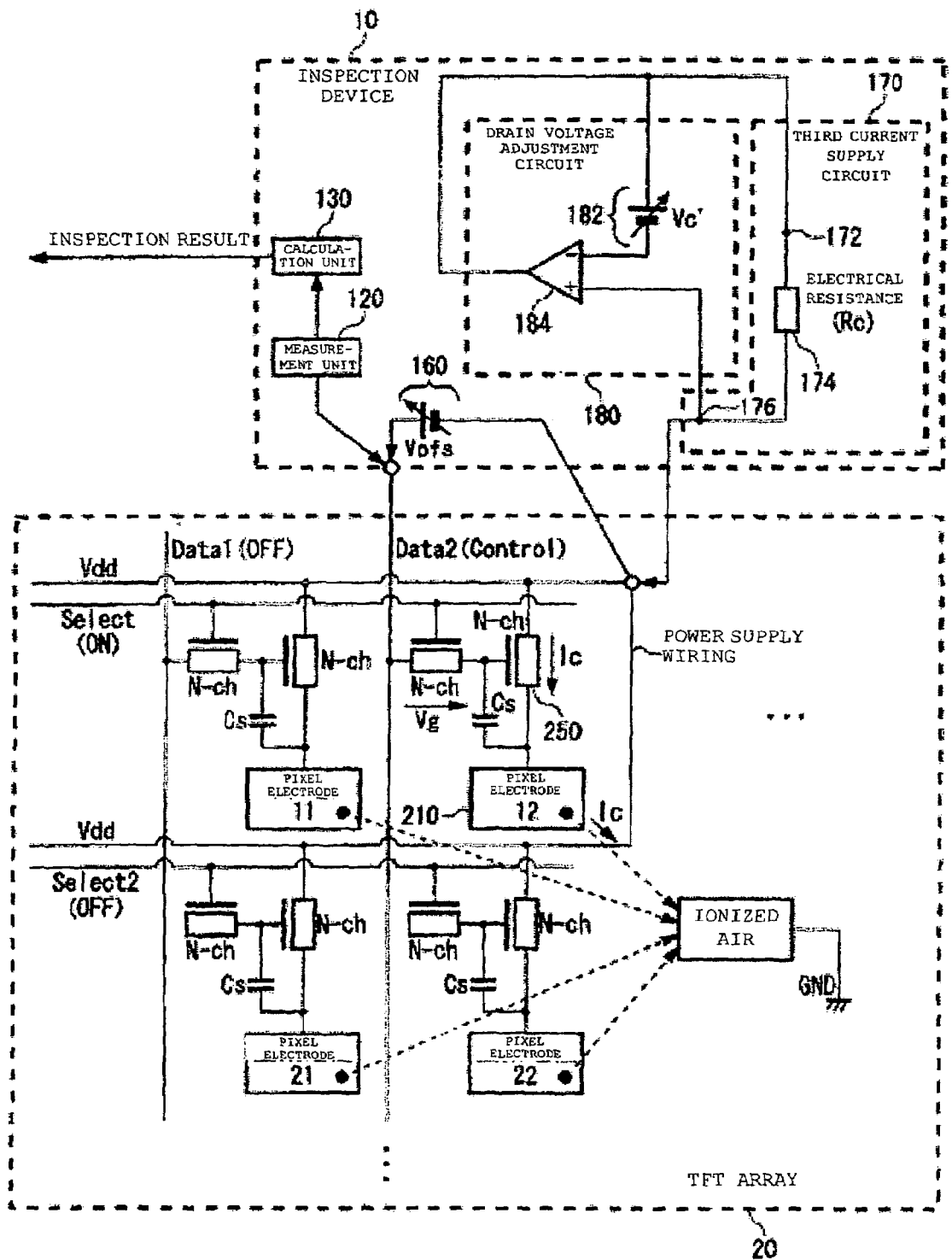
FIG. 10 shows a block diagram of an inspection device 10 in a first modified example.

FIG. 10 shows a block diagram of an inspection device 10 in a first modified example. An object of the inspection device 10 in this example is, similarly to the inspection device 10 shown in FIG. 7, to calculate the value β and threshold voltage Vth even when the source voltage of a TFT is unknown. This drawing will describe a case where the inspection device 10 inspects a TFT 250 in the layout shown in FIG. 5(c).

By being subjected to blowing ionized air 215, a pixel electrode connected with the source of the TFT 250 shown in this drawing has a potential difference of an unknown and variable magnitude from a ground potential. The inspection device 10, in addition to the configuration of the inspection device 10 shown in FIG. 7, further includes a potential difference retaining circuit 160, a third current supply circuit 170, and a drain voltage adjustment circuit 180. Moreover, the inspection device 10 in this drawing does not need to include the gate voltage application circuit 135, the second current supply circuit 140, and the drain current adjustment circuit 150.

The potential difference retaining circuit 160 maintains such a potential difference as to cause the TFT 250 to operate in the linear region between the gate and drain voltages of the TFT 250. Specifically, the potential difference (Vofs) to be retained by the potential difference retaining circuit 160 is set to a value which is sufficiently larger than a predicted value of the threshold voltage (Vth). The third current supply circuit 170 supplies a drain current between the drain and source of the TFT 250 by applying a drain voltage to the drain of the TFT 250 through the power supply wiring.

As for a concrete circuit configuration of the third current supply circuit 170, it includes an input terminal 172, an electrical resistance 174, and an output terminal 176. One end of the electrical resistance 174 is connected with the input terminal 172 and the other end thereof is connected with the output terminal 176. Moreover, the electrical resistance 174 has such a resistance value as to allow the third current supply circuit 170 to output a preset set current (Ic) when a potential difference between the input terminal 172 and the output terminal 176 is equal to a predetermined specified potential.

The drain voltage adjustment circuit 180 adjusts the drain voltage so that the set current (Ic) flows between the drain and source of the TFT 250. As for a concrete circuit configuration of the drain voltage adjustment circuit 180, it includes a potential difference setting circuit 182 and an amplifier 184. The potential difference setting circuit 182 receives an input of a potential of the input terminal 172 and provides the amplifier 184 with an output of a voltage which is different from the potential of the input terminal 172 by a specified potential. The amplifier 184 receives an input of the output of the potential difference setting circuit 182 at the inverting input terminal and an input of a potential of the output terminal 176 at the non-inverting input terminal. When the output of the potential difference setting circuit 182 is different from the potential of the output terminal 176, the amplifier 184 applies, to the input terminal 172, such a voltage as to make the output of the potential difference setting circuit 182 equal to the potential of the output terminal 176.

The measurement unit 120 causes the drain voltage adjustment circuit 180 to sequentially adjust the drain voltages so that at least two different set currents flow. The measurement unit 120 then sequentially measures-gate voltages when the drain voltages are adjusted by the drain voltage adjustment circuit 180. The calculation unit 130 calculates the threshold voltage Vth, based on the measured gate voltages, the set currents, and the value β calculated beforehand. Specifically, the calculation unit 130 sequentially substitutes the measurement results into the aforementioned expressions (6)' and solves the expressions (6)' which are simultaneous expressions, thereby calculating the threshold voltage Vth. More specifically, it is possible to calculate the threshold voltage Vth by using the following expression (7).

[Expression 7]

$$Vth = Vofs - \frac{\sqrt{Id_1^2 + \left(Id_2 - \frac{\beta}{2}(Vg_1 - Vg_2)^2\right)^2 - 2 \cdot Id_1\left(Id_2 + \frac{\beta}{2}(Vg_1 - Vg_2)^2\right)}}{\beta(Vg_1 - Vg_2)} \quad (7)$$

Figure 11:
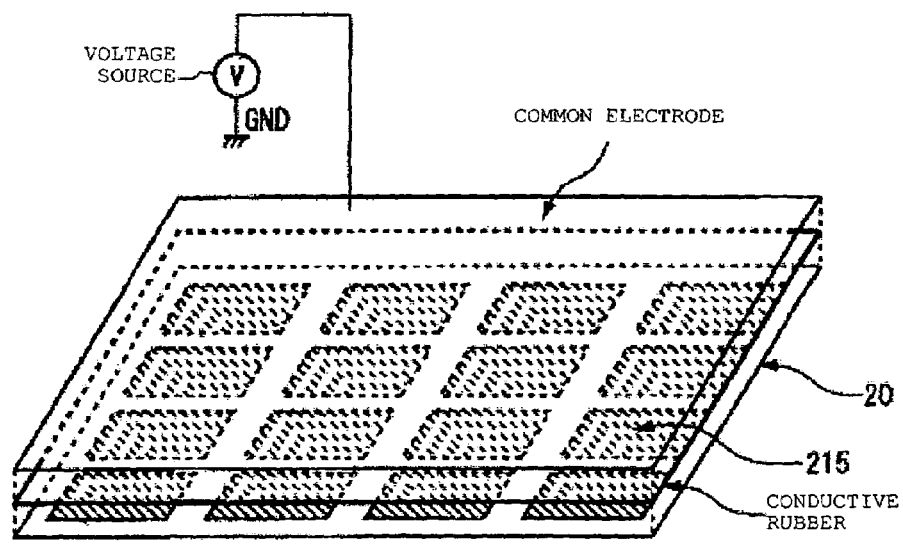
FIG. 11(a) shows a conceptual diagram of an inspection device 10 in a second modified example.
FIG. 11(b) shows an equivalent circuit to a circuit where the inspection device 10 inspects a TFT array 20 in the second modified example.
Figure 11:
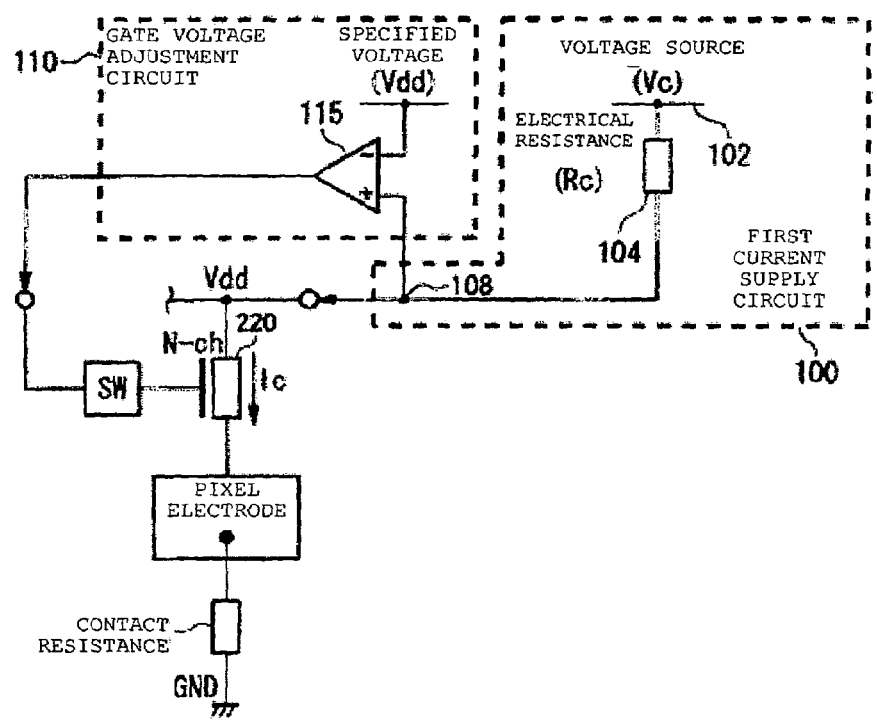

FIG. 11(*a*) shows a conceptual diagram of an inspection device 10 in a second modified example. In this example, a description will be given of a case of adopting another method in order to allow a current to flow in a pixel electrode. Specifically,. a pixel electrode connected with each TFT included in a TFT array 20 is in contact with an inspection probe, instead of being subjected to blowing ionized air. More specifically, the pixel electrodes are pressed onto a piece of conductive rubber, and a voltage source connected with a common electrode is connected with this conductive rubber. Apart from this example, the inspection probe may be inspection needles, conductive silicon, or the like.

FIG. 11(*b*) shows an equivalent circuit to a circuit where the inspection device 10 inspects the TFT array 20 in the second modified example. The source of a TFT 220 included in the TFT array 20 is connected with the pixel electrode, and this pixel electrode is grounded by a contact resistance of an unknown magnitude.

The first current supply circuit 100 supplies a current between the drain and source of the TFT 220 by applying, to the drain of the TFT 220, such a voltage as to allow the N-channel TFT 220 to operate in the saturation region. Since a concrete circuit configuration of this first current supply circuit 100 is substantially the same as that of the first current supply circuit 100 shown in FIG. 8(*a*), a description thereof will be omitted.

The gate voltage adjustment circuit 110 sequentially adjusts gate voltages to be applied to the TFT 220 so that at least three different specified currents flow between the drain and source of the TFT 220. Since a concrete circuit configuration of this gate voltage adjustment circuit 110 is substantially the same as that of the gate voltage adjustment circuit 110 shown in FIG. 8(*a*), a description thereof will be omitted. The measurement unit 120 sequentially measures the gate voltages adjusted by the gate voltage adjustment circuit 110. The calculation unit 130 then calculates the value β and the threshold voltage Vth, based on the measured gate voltages. Concrete processing about this will be described.

When the pixel electrode has a contact resistance R, since the pixel electrode has a voltage drop R×Id, the expression (3) can be transformed into the following expression (8).

[Expression 8]

$$\sqrt{Id} = \sqrt{\frac{\beta}{2}}(Vg - R \cdot Id - Vth) \quad (8)$$

The calculation unit 130 substitutes the measurement results obtained by the measurement unit 120 into the expression (8), thereby obtaining expressions (9).

[Expression 9]

$$\sqrt{Id_1} = \sqrt{\frac{\beta}{2}}(Vg_1 - R \cdot Id_1 - Vth)$$

$$\sqrt{Id_2} = \sqrt{\frac{\beta}{2}}(Vg_2 - R \cdot Id_2 - Vth) \quad (9)$$

$$\sqrt{Id_3} = \sqrt{\frac{\beta}{2}}(Vg_3 - R \cdot Id_3 - Vth)$$

Herein, $Vg_1$, $Vg_2$ and $Vg_3$ denote gate voltages measured by the measurement unit 120; and $Id_1$, $Id_2$ and $id_3$ denote specified currents at time points when $Vg_1$, $Vg_2$ and $Vg_3$ are measured, respectively. Here, since there are three unknowns, β, R and Vth, in these simultaneous expressions, the calculation unit 130 can calculates β, R and Vth by solving the expressions (9).

As described above, according to this example, it is possible to properly calculate the value β and the threshold voltage Vth even when a pixel electrode has a contact resistance.

Figure 12:
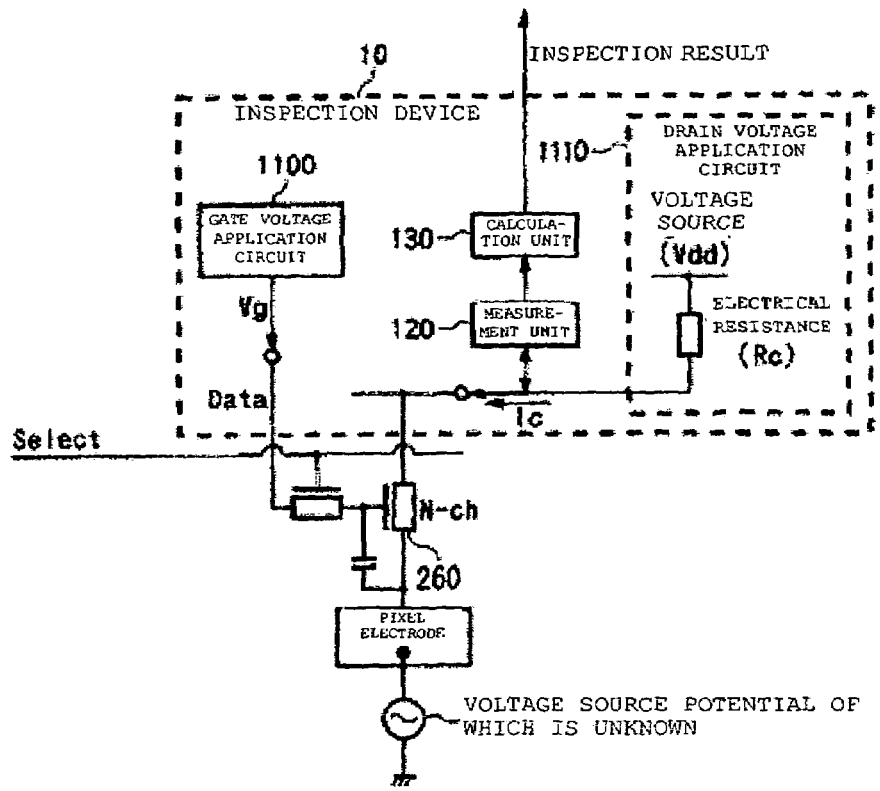
FIGS. 12(a) and 12(b) show block diagrams of an inspection device 10 in a third modified example.
Figure 12:
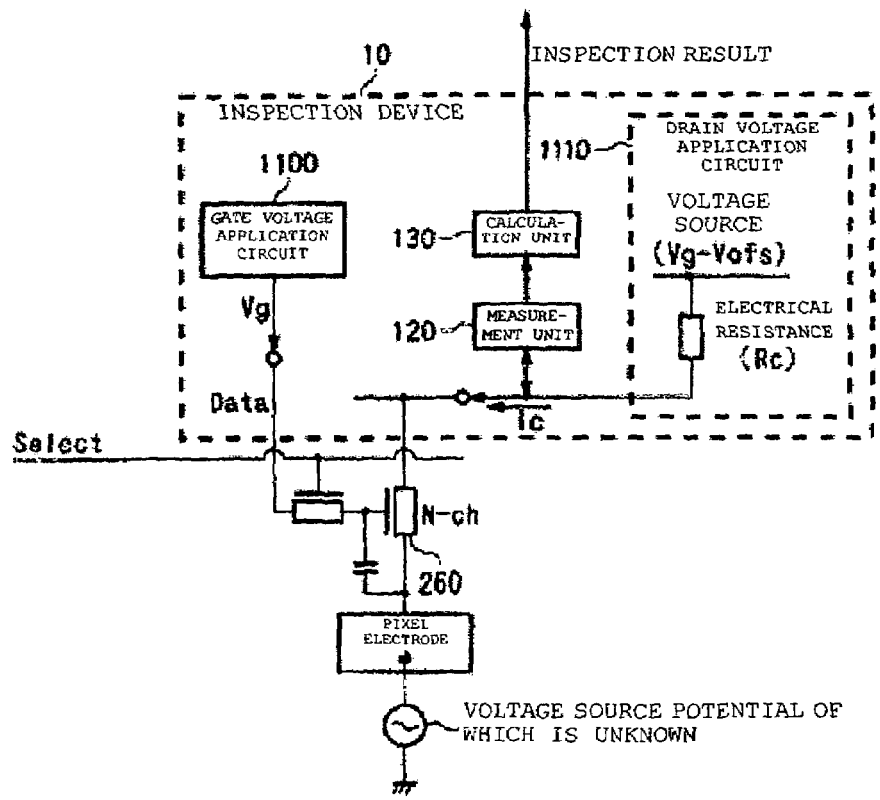

FIGS. 12(*a*) and 12(*b*) each show a block diagram of an inspection device 10 in a third modified example. In this example, the source or drain of each TFT included in the TFT array 20 is connected with a pixel electrode. The pixel electrode has a potential difference the magnitude of which is unknown and hardly variable from a ground potential. For example, the pixel electrode is irradiated with an electron beam or ion beam which causes relatively small variation in the potential. In this case, unlike the example shown in FIG. 2, the inspection device 10 can calculate the value β and the threshold voltage Vth with a more simplified configuration.

FIG. 12(*a*) shows a circuit where the inspection device 10 calculates the value β of a TFT 260 when the source of the N-channel TFT 260 is grounded. The inspection device 10 includes a gate voltage application circuit 1100 and a drain voltage application circuit 1110. The gate voltage application circuit 1100 applies a gate voltage to the TFT 260. The drain voltage application circuit 1110 applies, between the drain and source of the TFT 260, such a voltage as to cause the TFT 260 to operate in the saturation region. Specifically, since the source of the TFT 260 is connected with the pixel electrode, the drain voltage application circuit 1110 applies the voltage to the drain of the TFT 260.

The measurement unit 120 measures a drain current of the TFT 260 for each of at least two voltages applied by the gate voltage applying 1100. The calculation unit 130 calculates the value β of the TFT 260, based on two sets of the gate voltage and the measured drain current. Specifically, the calculation unit 130 substitutes each set of the gate voltage and the drain current for Vg and Id in the aforementioned expression (4)', respectively, thereby creating simultaneous expressions. Then, the calculation unit 130 can calculate the values β and (Vs+Vth) by solving these simultaneous expressions.

FIG. 12(b) shows a circuit where the inspection device 10 calculates the threshold voltage Vth of the TFT 260 when the source of the N-channel TFT 260 is grounded. When the calculation unit 130 has calculated the value β, the drain voltage application circuit 1110 applies to the TFT 260 at least two drain voltages (for example, Vg−Vofs) which cause the TFT 260 to operate in the linear region. The measurement unit 120 then measures a drain current of TFT 260 for each of the drain voltages applied by the drain voltage application circuit 1110.

The calculation unit 130 then calculates the threshold voltage Vth, based on the value which has been calculated already and on the drain currents measured by the measurement unit 120. Specifically, the calculation unit 130 may calculates the threshold voltage Vth by substituting each set of the drain current, the gate voltage and the value β into the aforementioned expressions (6)' and then solving the simultaneous expressions obtained as a result of the substitution.

As described above, when the potential of a pixel electrode is stable, the inspection device 10 can calculate the value β and the threshold voltage Vth with a more simplified configuration.

Figure 13:
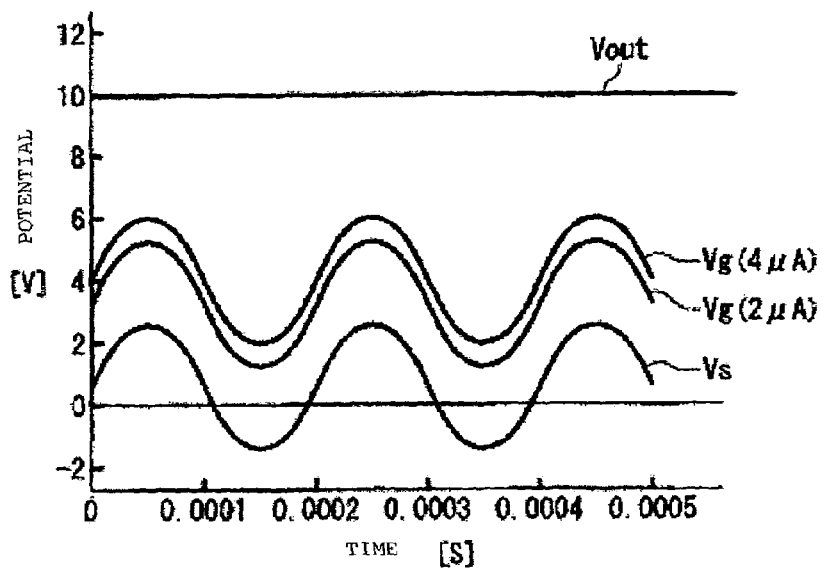
FIGS. 13(a) and 13(b) show results of a simulation where the inspection device 10 shown in FIG. 1 inspects the TFT array 20.

FIGS. 13(a) and 13(b) show results of a simulation where the inspection device 10 shown in FIG. 1 inspects the TFT array 20. As shown in these drawings, when ionized air is blown onto the pixel electrodes, there are some occasions where the source voltage (Vs), periodically changes. Even in this case, the gate voltage adjustment circuit 110 maintains a constant drain current to be supplied from the first current supply circuit 100 by maintaining a constant output potential (Vout) of the first current supply circuit 100. As a result, the gate voltage (Vg) varies with changes in the source voltage (Vs). For example, these drawings show gate voltages (Vg (4 μA)) when the drain current is set to 4 μA which is a specified current, and gate voltages (Vg (2 μA)) when the drain current is set to 2 μA which is another specified current.

As shown in FIG. 13(b), the calculation unit 130 can calculate the value β based on an average of the gate voltages when the drain current is 4 μA and on an average of the gate voltages when the drain current is 2 μA. In the example of this drawing, the threshold voltage Vth of a TFT is 1.5 V and the value β is 2 μA/V² in practice. By comparison, the inspection device 10 calculated that the threshold voltage Vth was 1.4 V and that the value β was 2.04 μA/V², as results of inspection. As described above, according to the present embodiment, the inspection device 10 can calculate the value β with high precision.

Figure 14:
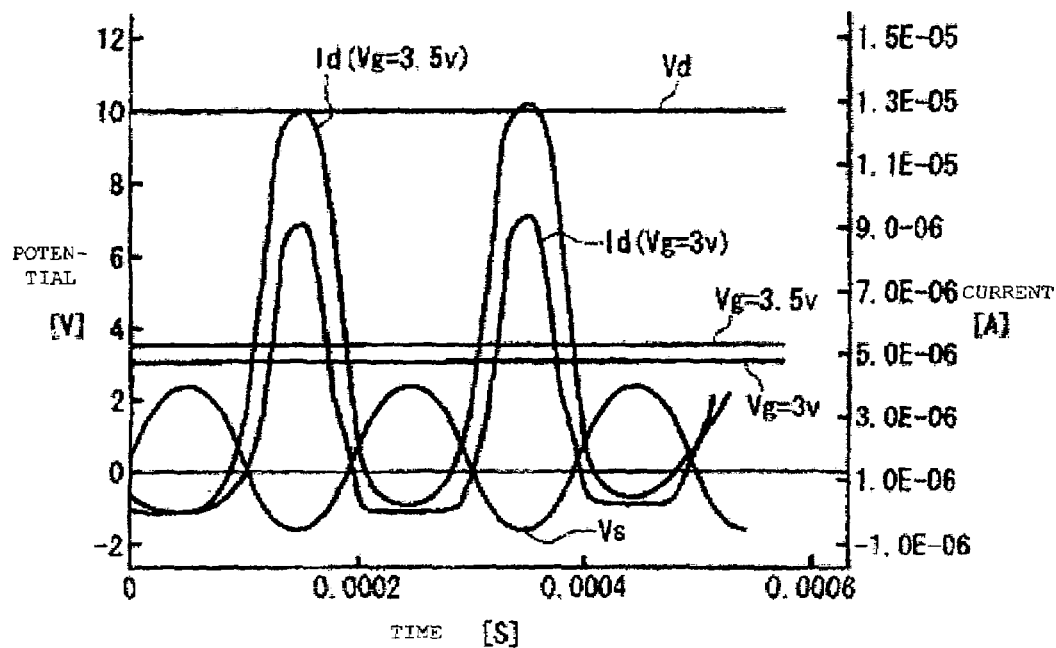
FIGS. 14(a) and 14(b) show results of a simulation where the TFT array 20 is inspected using a conventional technique.

FIGS. 14(a) and 14(b) show results of a simulation where the TFT array 20 is inspected using a conventional technique. According to the conventional technique, it is very difficult to calculate the value β. As an example, a description will be given of a method of measuring the drain current (Id) flowing when the drain voltage (Vd) and the gate voltage (Vg) are fixed, for example.

According to this method, the drain current (Id) varies with changes in the source voltage (Vs). Specifically, a TFT inverts its state into an off state where the drain current is not allowed to flow or into an on state where the drain current is allowed to flow and where the TFT reaches a saturated state. In this case, an average of the drain currents is not a significant value, and therefore it is difficult to calculate the value β by using such a technique as to simply calculate an average of the drain currents (Id).

Figure 15:
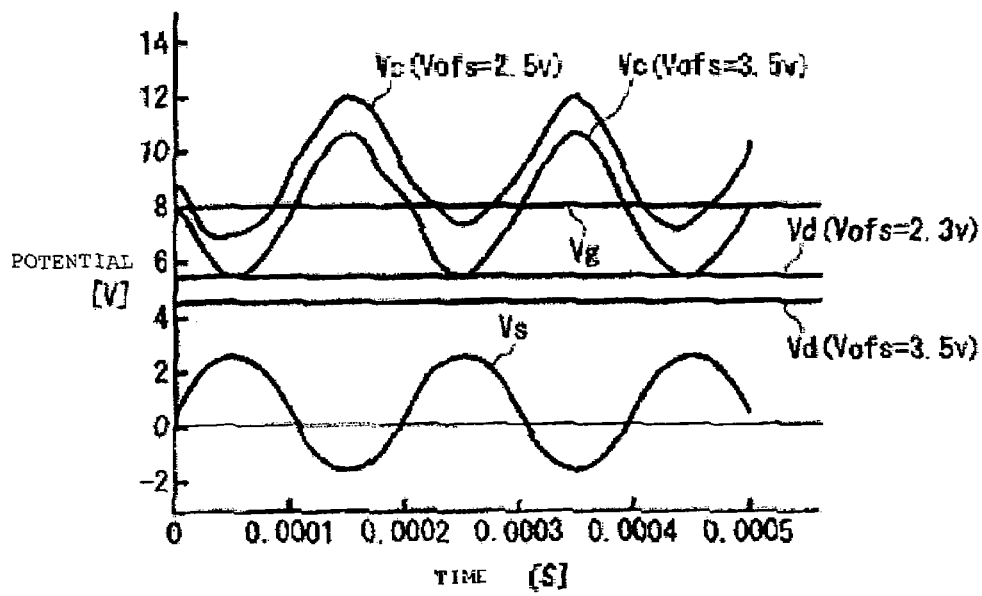
FIGS. 15(a) and 15(b) show results of a simulation where the inspection device 10 shown in FIG. 7 inspects the TFT array 20.
Figure 17:
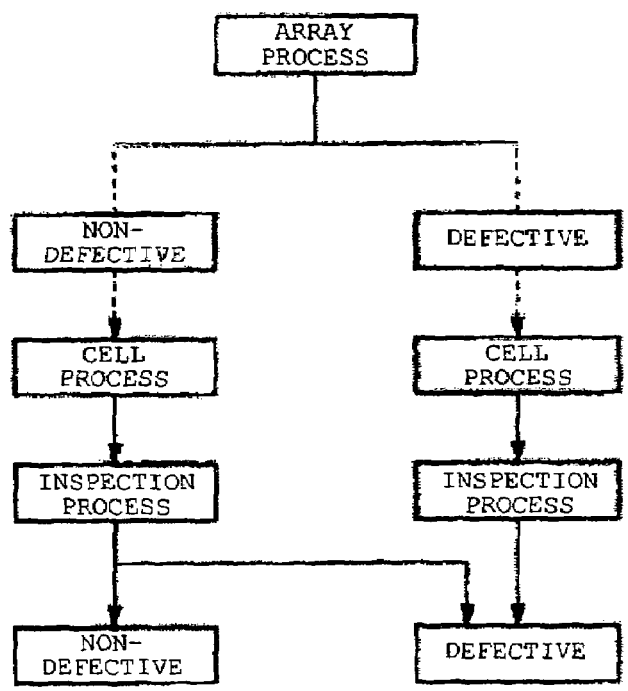
FIGS. 17(a) and 17(b) each show processes through which an organic EL display panel with OLEDs is manufactured.
Figure 17:
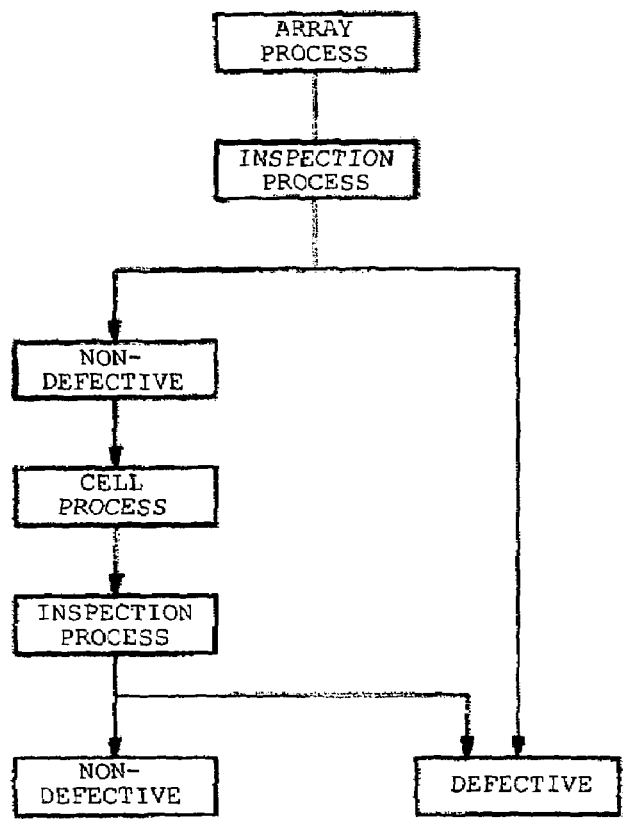

FIGS. 15(a) and 15(b) show results of a simulation where the inspection device 10 shown in FIG. 7 inspects the TFT array 20. Similarly to the case of FIGS. 13(a) and 13(b), the source voltage (Vs) varies with time. In order to maintain a constant potential difference (Vofs) between the gate voltage (Vg) and the drain voltage (Vd), the drain current adjustment circuit 150 adjusts the drain current (Id) by adjusting the voltage (Vc) to be applied to the second current supply circuit 140. These drawings show drain voltages (Vd) and voltages (Vc) to be applied to the second current supply circuit 140 when the gate voltage (Vg) is set to 8 V and the potential difference (Vofs) is set to 2.5 V or 3.5 V.

The calculation unit 130 calculates an average of the drain currents, based on an average of the voltages (Vc) to be applied to the second current supply circuit 140. As a result, the calculation unit 130 can calculate the threshold voltage Vth, based on at least two sets of a drain current, a gate voltage and a drain voltage. In the example of these drawings, the threshold voltage of a TFT is 1.5 V in practice. By comparison, the inspection device 10, as a result of inspection, calculated that the threshold voltage Vth was 1.48 V. As described above, according to the present embodiment, the inspection device 10 can calculate the threshold voltage Vth with high precision.

FIG. 16(a) shows results of a simulation where the inspection device 10 shown in FIG. 11 inspects the TFT array 20. Even when a contact resistance to a pixel electrode in the TFT array 20 varies in a range from 1 kΩ to 50 kΩ, the inspection device 10 can properly calculate the value β and the threshold voltage Vth.

Meanwhile, FIG. 16(b) shows results of a simulation where, while the pixel electrodes are in contact with conductive rubber or the like, the TFT array 20 is inspected using a conventional method. The conventional method is a method in which the drain currents (Id) when given gate voltages (Vg) are applied to a TFT are measured, and the value β and the threshold voltage Vth is calculated based on the measured drain currents. Although source voltages (Vs) are listed in the table of this drawing, it is practically difficult to measure the source voltage, and therefore calculation is performed using a gate voltage (Vg) for a voltage (Vgs) between the source and gate. Accordingly, as the resistance value increases, errors of the calculated value β and the like become large.

As described through the present embodiment above, the inspection device 10 can accurately measure the characteristic of each TFT, for example, when each pixel electrode in the TFT array 20 is grounded in a non-contact mode, and even when the source voltage of each TFT is unknown. Moreover, even when the source voltage fluctuates, the inspection device 10 can measure the characteristic of each TFT by maintaining a constant drain current of each TFT. Furthermore, the inspection device 10 can accurately measure the characteristic of each TFT, for example, when each pixel electrode in the TFT array 20 is brought in contact with another electrode, and even when a contact resistance of an unknown magnitude occurs.

In addition, according to the present embodiment, using a configuration in which a general A/D converter is added to a computer, the inspection device 10 can calculate the value β and the threshold voltage Vth through arithmetic processing by a microprocessor or the like. Accordingly, an integrating circuit with high precision, a micro current measurement circuit or the like becomes unnecessary, and it is thus possible to reduce manufacturing or management costs of the inspection device 10.

According to the above-described embodiment, inspection devices described in the following respective items are realized.

(Item 1) An inspection device which inspects a thin film transistor (TFT) for supplying a current to a light emitting element, the inspection device comprising: a first current supply circuit which supplies a drain current between a drain and a source of the TFT; a gate voltage adjustment circuit which adjust a gate voltage to be applied to a gate of the TFT so as to allow a predetermined specified current to flow between the drain and source of the TFT; and a measurement unit which measures the gate voltage adjusted by the gate voltage adjustment circuit.

(Item 2) The inspection device according to Item 1, wherein when the drain current supplied by the first current supply circuit is larger than the specified current, the gate voltage adjustment circuit adjusts the gate voltage so as to reduce the drain current in question, and when the drain current supplied by the first current supply circuit is smaller than the specified current, the gate voltage adjustment circuit adjusts the gate voltage so as to increase the drain current in question.

(Item 3) The inspection device according to Item 2, wherein the first current supply circuit includes: a voltage source having a predetermined potential; an electrical resistance connected with the voltage source; and an output terminal connected with the electrical resistance and supplying a current to the TFT, wherein the potential of the voltage source and a resistance value of the electrical resistance are adjusted such that the first current supply circuit supplies-the specified current when a potential of the output terminal is equal to a predetermined specified voltage, and wherein the gate voltage adjustment circuit includes an amplifier which receives inputs of the potential of the output terminal and the specified voltage and, when the potential of the output terminal is different from the specified voltage, applies to the TFT such a gate voltage as to make the potential of the output terminal equal to the specified voltage.

(Item 4) The inspection device according to Item 1, further comprising a calculation unit, wherein the TFT operates in a linear region where the drain current varies substantially linearly with voltages between the drain and source or in a saturation region where the drain current varies less than in the linear region; one of the drain and source of the TFT has a potential difference of an unknown and variable magnitude from a ground potential; the first current supply circuit supplies a drain current by applying such a voltage as to cause the TFT to operate in the saturation region to the other one of the drain and source of the TFT; the gate voltage adjustment-circuit sequentially adjusts the gate voltages so as to allow the at least two specified currents of different magnitudes from each other to sequentially flow between the drain and source; the measurement unit sequentially measures the at least two gate voltages adjusted by the gate voltage adjustment circuit; and the calculation unit calculates a value β which is a parameter indicating a current supply ability between the drain and source of the TFT, based on the measured gate voltages.

(Item 5) The inspection device according to Item 4, further comprising a second current supply circuit which supplies a drain current between the drain and source of the TFT by applying a drain voltage to the drain of the TFT, the source of which has the potential difference of an unknown and variable magnitude from the ground potential; a gate voltage application circuit which applies a predetermined gate voltage to the gate of the TFT; and a drain current adjustment circuit which adjusts the drain current supplied by the second current supply circuit so as to make a potential difference between the gate voltage and the drain voltage become a preset set potential and so as to cause the TFT to operate in the linear region, wherein the measurement unit sequentially measures the drain currents adjusted by the drain current adjustment circuit for the at least two different set potentials, and the calculation unit calculates a threshold voltage which is a potential difference between the gate and source of the TFT necessary to allow a current to flow between the drain and source of the TFT, based on the sequentially measured drain currents and the calculated value β.

(Item 6) The inspection device according to Item 4, wherein the source of the TFT is grounded via an electrical resistance of an unknown magnitude; the first current supply circuit supplies a drain current between the drain and source of the TFT by applying a drain voltage to the drain of the TFT; the gate voltage adjustment circuit sequentially adjusts the gate voltages so as to allow the at least three specified currents of different magnitudes from one another to sequentially flow between the drain and source; the measurement unit sequentially measures the at least three gate voltages adjusted by the gate voltage adjustment circuit; and the calculation unit calculates the value β and a threshold voltage which is a potential difference between the gate and source of the TFT necessary to allow a current to flow between the drain and source of the TFT, based on the measured gate voltages.

(Item 7) The inspection device according to Item 4, wherein the inspection device is a device which inspects a TFT array including a plurality of TFTs arrayed in matrix, wherein the first current supply circuit sequentially supplies a current between the drain and source of each TFT included in the TFT array; the gate voltage adjustment circuit sequentially adjusts the gate voltages so as to allow the at least two specified currents of different magnitudes from each other to sequentially flow between the drain and source of a TFT to which the current is supplied by the first current supply circuit; the measurement unit measures the gate voltage adjusted for each of the plurality of TFTs; and the calculation unit calculates the value β for each of the plurality of TFTs and, when a range of dispersion of the value β for each TFT is wider than a predetermined reference, provides an output to the effect that the TFT array is defective.

(Item 8) The inspection device according to Item 1, wherein the inspection device inspects a TFT array including a plurality of TFTs arrayed in matrix and further comprises a calculation unit, wherein the first current supply circuit sequentially supplies a current between the drain and source of each TFT included in the TFT array; the gate voltage adjustment circuit sequentially adjusts the gate voltages so as to allow the at least two specified currents of different magnitudes from each other to sequentially flow between the drain and source of a TFT to which the current is supplied by the first current supply circuit; the measurement unit measures the gate voltages adjusted for each of the plurality of TFTS; and the calculation unit, based on the at least two measured gate voltages and for each of the plurality of TFTs, calculates a threshold of a potential difference between the gate voltage and a ground potential necessary to allow a current to flow between the drain and source of the TFT and, when a range of dispersion of the threshold calculated for each TFT is wider than a predetermined reference, provides an output to the effect that the TFT array is defective.

(Item 9) The inspection device according to Item 8, further comprising an offset current measurement unit, wherein the TFT array includes power supply wiring common to the plurality of TFTs; the first power supply circuit supplies a drain current between the drain and source of each of the TFTs through the power supply wiring; and the offset current measurement unit measures a magnitude of an offset current which is supplied from the first current supply circuit to the power supply wiring in a state where all the TFTs in the TFT array are not driven and, when the measurement unit measures the gate voltages, further supplies the offset current to the power supply wiring.

(Item 10) An inspection device which inspects a thin film transistor (TFT) for supplying a current to a light emitting element, the TFT operating in a linear region where the drain current varies substantially linearly with voltages between a drain and a source of the TFT or in a saturation region where the drain current varies less than in the linear region, the source of the TFT having a potential difference of an unknown and variable magnitude from a ground potential, the inspection device comprising: a second current supply circuit which supplies a drain current between the drain and source of the TFT by applying a drain voltage to the drain of the TFT; a gate voltage application circuit which applies a predetermined gate voltage to a gate of the TFT; a drain current adjustment circuit which adjusts the drain current supplied by the second current supply circuit so as to make a potential difference between the gate voltage and the drain voltage become a preset set potential and so as to cause the TFT to operate in the linear region; a measurement unit which sequentially measures the drain currents adjusted by the drain current adjustment circuit for the at least two different set potentials; and a calculation unit which calculates a threshold voltage that is a threshold of a potential difference between the gate and source of the TFT necessary to allow a current to flow between the drain and source of the TFT, based on the sequentially measured drain currents and a value $\beta$ that is a parameter indicating a current supply ability between the drain and source of the TFT.

(Item 11) The inspection device according to Item 10, wherein the second current supply circuit includes: an input terminal; an electrical resistance one end of which is connected with the input terminal; and an output terminal which is connected with the other end of the electrical resistance and supplies a current to the drain of the TFT, and wherein the drain current adjustment circuit includes: a potential difference setting circuit which receives an input of the drain voltage and outputs a voltage that is different from the inputted drain voltage by the set potential; and an amplifier which receives, as inputs, the output of the potential difference setting circuit and the gate voltage and, when the output voltage of the potential difference setting circuit is different from the gate voltage, applies to the input terminal such a voltage as to make the output voltage of the potential difference setting circuit equal to the gate voltage.

(Item 12) An inspection device which inspects a thin film transistor (TFT) for supplying a current to a light emitting element, the TFT operating in a linear region where the drain current varies substantially linearly with voltages between a drain and a source of the TFT or in a saturation region where the drain current varies less than in the linear region, the source of the TFT having a potential difference of an unknown and variable magnitude from a ground potential, the inspection device comprising: a potential difference retaining circuit which maintains such a potential difference as to cause the TFT to operate in the linear region between a gate voltage to be applied to a gate of the TFT and a drain voltage to be applied to the drain of the TFT; a third current supply circuit which supplies a drain current between the drain and source of the TFT by applying a drain voltage to the drain of the TFT; a drain voltage adjustment circuit which adjusts the drain voltage so as to allow a preset set current to flow between the drain and source of the TFT; a measurement unit which causes the drain voltage adjustment circuit to sequentially adjust the drain voltages so as to allow the at least two different set currents to flow, and sequentially measures the gate voltages when the drain voltages are adjusted; and a calculation unit which calculates a threshold voltage that is a threshold of a potential difference between the gate and source of the TFT necessary to allow a current to flow between the drain and source of the TFT, based on the measured gate voltages, drain currents calculated based on the gate voltages, and a value $\beta$ that is a parameter indicating a current supply ability between the drain and source of the TFT.

(Item 13) The inspection device according to Item 12, wherein the third current supply circuit includes: an input terminal; an output terminal; and an electrical resistance one end of which is connected with the input terminal, the other end of which is connected with the output terminal, and which has such a resistance value as to allow the third current supply circuit to output the set current when a potential difference between the input and output terminals is equal to a predetermined specified potential, and wherein the drain voltage adjustment circuit includes: a potential difference setting circuit which receives an input of a potential of the input terminal and outputs a voltage that is different from the potential of the input terminal by the specified potential; and an amplifier which receives, as inputs, a potential of the output terminal and the output voltage of the potential difference setting circuit and, when the potential of the output terminal is different from the output voltage of the potential difference setting circuit, applies to the input terminal such a voltage as to make the potential of the output terminal equal to the output voltage of the potential difference setting circuit.

(Item 14) An inspection device which inspects a thin film transistor (TFT) for supplying a current to a light emitting element, one of a drain and a source of the TFT having a potential difference of an unknown magnitude from a ground potential, the TFT operating in a linear region where the drain current varies substantially linearly with voltages between the drain and source of the TFT or in a saturation region where the drain current varies less than in the linear region, the inspection device comprising: a gate voltage application circuit which applies a gate voltage to a gate of the TFT; a drain voltage application circuit which applies between the drain and source such a voltage as to cause the TFT to operate in the saturation region; a measurement unit which measures a drain current flowing between the drain and source of the TFT for each of the at least two gate voltages applied by the gate voltage application circuit; and a calculation unit which calculates a value $\beta$ that is a parameter of a current supply ability between the drain and source of the TFT, based on the measured drain currents.

(Item 15) The inspection device according to Item 14, wherein the source of the TFT has a potential difference of an unknown and variable magnitude from a ground potential, and wherein when the calculation unit has calculated the value β, the drain voltage application circuit sequentially applies to the drain of the TFT such at least two voltages as to cause the TFT to operate in the linear region; the measurement unit measures a drain current flowing between the drain and source of the TFT for each of the voltages sequentially applied by the drain voltage application circuit; and the calculation unit calculates a threshold voltage which is a threshold of a potential difference between the gate and source necessary for the TFT to allow a current to flow between the drain and source, based on the calculated value β and the drain currents measured by the measurement unit.

Although the present invention has hitherto been described using the embodiment, the technical scope of the present invention is not limited to the scope described in the embodiment. It is apparent to those skilled in the art that it is possible to add various alterations or modifications to the above-described embodiment. It is apparent from description in the scope of claims that modes to which such alterations or modifications are added can be included in the technical scope of the present invention.

Although the preferred embodiment of the present invention has been described in detail, it should be understood that various changes, substitutions and alternations can be made therein without departing from spirit and scope of the inventions as defined by the appended claims.

What is claimed is:

1. An inspection device adapted to inspect a thin film transistor (TFT) for supplying a current to a light emitting element, said inspection device comprising:

a first current supply circuit adapted to supply a drain current between a drain and a source of said TFT;

a gate voltage adjustment circuit adapted to adjust a gate voltage to be applied to a gate of said TFT so as to allow a predetermined specified current to flow between said drain and said source of said TFT;

a measurement unit adapted to measure said gate voltage adjusted by said gate voltage adjustment circuit; and a calculation unit operatively connected to said measurement unit and adapted to calculate a threshold voltage that is a threshold of a potential difference between said gate and said source of said TFT necessary to allow a current to flow between said drain and said source of said TFT based on the sequentially measured drain currents and a value β that is a parameter indicating a level of current supply between said drain and said source of said TFT, wherein when said drain current supplied by said first current supply circuit is larger, as determined by said gate voltage adjustment circuit, than said predetermined specified current, then said gate voltage adjustment circuit is adapted to adjust said gate voltage so as to reduce said drain current, and when said drain current supplied by said first current supply circuit is smaller than said predetermined specified current, then said gate voltage adjustment circuit is adapted to adjust said gate voltage so as to increase said drain current, wherein said first current supply circuit comprises:

a voltage source having a predetermined potential;

an electrical resistance operatively connected to said voltage source; and an output terminal operatively connected to said electrical resistance and adapted to supply a current to said TFT, wherein said predetermined potential of said voltage source and a resistance value of said electrical resistance are adjusted such that said first current supply circuit supplies said drain current when a potential of said output terminal is equal to a predetermined specified voltage, and wherein said gate voltage adjustment circuit comprises an amplifier adapted to receive inputs of said potential of said output terminal and said predetermined specified voltage and, when said potential of said output terminal is different from said predetermined specified voltage, said amplifier is adapted to apply a gate voltage to said TFT so as to make said potential of said output terminal equal to said predetermined specified voltage.

2. The inspection device according to claim 1, wherein said TFT operates in a linear region where said drain current varies substantially linearly with voltages between said drain and said source or in a saturation region where said drain current varies less than in said linear region, wherein one of said drain and said source of said TFT has a potential difference of an unknown and variable magnitude from a ground potential, wherein said first current supply circuit is adapted to supply said drain current by applying such a voltage so as to cause said TFT to operate in said saturation region to an other one of said drain and said source of said TFT, wherein said gate voltage adjustment circuit is adapted to sequentially adjust gate voltages so as to allow at least two specified currents of different magnitudes from each other to sequentially flow between said drain and said source, wherein said measurement unit is adapted to sequentially measure said at least two gate voltages adjusted by said gate voltage adjustment circuit, and wherein said calculation unit is adapted to calculate said value β, wherein said value β indicating a level of current supply between said drain and said source of said TFT is based on the measured gate voltages.

3. The inspection device according to claim 2, further comprising:

a second current supply circuit adapted to supply a drain current between said drain and said source of said TFT by applying a drain voltage to said drain of said TFT, wherein said source comprises a potential difference of an unknown and variable magnitude from said ground potential;

a gate voltage application circuit adapted to apply a predetermined gate voltage to said gate of said TFT; and a drain current adjustment circuit adapted to adjust said drain current supplied by said second current supply circuit so as to make a potential difference between said gate voltage and said drain voltage become a preset set potential and so as to cause said TFT to operate in said linear region, and wherein said measurement unit is adapted to sequentially measure drain currents adjusted by said drain current adjustment circuit for at least two different set potentials.

4. The inspection device according to claim 2, wherein said inspection device is a device adapted to inspect a TFT array including a plurality of TFTs allayed in a matrix, wherein said first current supply circuit is adapted to sequentially supply said drain current between said drain and said source of each said TFT included in said TFT array, wherein said gate voltage adjustment circuit is adapted to sequentially adjust said gate voltages so as to allow said at least two specified currents of different magnitudes from each other to sequentially flow between said drain and said source of said TFT to which a current is supplied by said first current supply circuit, wherein said measurement unit is adapted to measure said gate voltage adjusted for each of said plurality of TFTs, and wherein said calculation unit is adapted to calculate said value β for each of said plurality of TFTs and when a range of dispersion of said value β for each said TFT is wider than a predetermined reference, then said calculation unit is adapted to provide an output indicating that said TFT array is defective.

5. The inspection device according to claim 1, wherein said inspection device is adapted to inspect a TFT away comprising a plurality of TFTs arranged in a matrix, wherein said first current supply circuit is adapted to sequentially supply said drain current between said drain and said source of each said TFT included in said TFT array, wherein said gate voltage adjustment circuit is adapted to sequentially adjust said gate voltage so as to allow at least two predetermined specified currents of different magnitudes from each other to sequentially flow between said drain and said source of said TFT to which a current is supplied by said first current supply circuit;

wherein said measurement unit is adapted to measure said gate voltages adjusted for each of said plurality of TFTs, and wherein when a range of dispersion of the threshold of potential difference calculated for each said TFT is wider than a predetermined reference, then said calculation unit is adapted to provide an output indicating that said TFT array is defective.

6. The inspection device according to claim 5, further comprising an offset current measurement unit, wherein said TFT array comprises power supply wiring common to said plurality of TFTs, wherein said first power supply circuit is adapted to supply said drain current between said drain and said source of each of said TFTs through said power supply wiring, and wherein said offset current measurement unit is adapted to measure a magnitude of an offset current which is supplied from said first current supply circuit to said power supply wiring in a state where all said TFTs in said TFT away are not driven and, when said measurement unit measures said gate voltages, then said offset current measurement unit is adapted to supply said offset current to said power supply wiring.

7. An inspection device adapted to inspect a thin film transistor (TFT) for supplying a current to a light emitting element, wherein said TFT is adapted to operate in any of (i) a linear region where a drain current varies substantially linearly with voltages between a drain and a source of said TFT, and (ii) a saturation region where said drain current varies less than in said linear region, wherein said source of said TFT comprises a potential difference of an unknown and variable magnitude from a ground potential, wherein said inspection device comprises:

a current supply circuit adapted to supply a drain current between said drain and said source of said TFT by applying a drain voltage to said drain of said TFT;

a gate voltage application circuit adapted to apply a predetermined gate voltage to a gate of said TFT;

a drain current adjustment circuit adapted to adjust said drain current supplied by said current supply circuit so as to make a potential difference between said gate voltage and said drain voltage become a preset set potential and so as to cause said TFT to operate in said linear region;

a measurement unit adapted to sequentially measure said drain current adjusted by said drain current adjustment circuit for at least two different set potentials; and a calculation unit operatively connected to said measurement unit and adapted to calculate a threshold voltage that is a threshold of a potential difference between said gate and said source of said TFT necessary to allow a current to flow between said drain and said source of said TFT based on the sequentially measured drain currents and a value β that is a parameter indicating a level of current supply between said drain and said source of said TFT, wherein said current supply circuit comprises:
an input terminal;
an electrical resistance comprising a first end operatively connected to said input terminal; and
an output terminal operatively connected with a second end of said electrical resistance and adapted to supply current to said drain of said TFT, and wherein said drain current adjustment circuit comprises:
a potential difference setting circuit adapted to receive an input of said drain voltage and output a voltage that is different from the input drain voltage by said set potential; and
an amplifier adapted to receive, as input, said output of said potential difference setting circuit and said gate voltage and, when said output voltage of said potential difference setting circuit is different from said gate voltage, said amplifier is adapted to apply to said input terminal such a voltage so as to make said output voltage of said potential difference setting circuit equal to said gate voltage.

8. An inspection device adapted to inspect a thin film transistor (TFT) for supplying a current to a light emitting element, wherein said TFT is adapted to operate in any of (i) a linear region where a drain current varies substantially linearly with voltages between a drain and a source of said TFT, and (ii) a saturation region where said drain current varies less than in said linear region, wherein said source of said TFT comprises a potential difference of an unknown and variable magnitude from a ground potential, wherein said inspection device comprises:

a potential difference retaining circuit adapted to maintain such a potential difference so as to cause said TFT to operate in said linear region between a gate voltage to be applied to a gate of said TFT and a drain voltage to be applied to said drain of said TFT;

a current supply circuit adapted to supply a drain current between said drain and said source of said TFT by applying said drain voltage to said drain of said TFT;

a drain voltage adjustment circuit adapted to adjust said drain voltage so as to allow a preset set current to flow between said drain and said source of said TFT;

a measurement unit adapted to cause said drain voltage adjustment circuit to sequentially adjust said drain voltage so as to allow at least two different set currents to flow, wherein said measurement unit is adapted to sequentially measure said gate voltage when said drain voltage is adjusted; and a calculation unit operatively connected to said measurement unit and adapted to calculate a threshold voltage that is a threshold of a potential difference between said gate and said source of said TFT necessary to allow a current to flow between said drain and said source of said TFT based on the sequentially measured gate voltages, drain currents calculated based on gate voltages, and a value β that is a parameter indicating a level of current supply between said drain and said source of said TFT, wherein said current supply circuit comprises:
an input terminal;
an output terminal; and
an electrical resistance comprising a first end operatively connected to said input terminal, and a second end operatively connected to said output terminal, wherein said electrical resistance comprises a resistance value so as to allow said current supply circuit to output said set current when a potential difference between the input and output terminals is equal to a predetermined specified potential, and wherein said drain voltage adjustment circuit comprises:
a potential difference setting circuit adapted to receive an input of a potential of said input terminal and output a voltage that is different from said potential of said input terminal by said predetermined specified potential; and an amplifier adapted to receive, as input, a potential of said output terminal and the output voltage of said potential difference setting circuit and, wherein when said potential of said output terminal is different from said output voltage of said potential difference setting circuit, then said amplifier is adapted to apply to said input terminal such a voltage so as to make said potential of said output terminal equal to said output voltage of said potential difference setting circuit.

9. An inspection device adapted to inspect a thin film transistor (TFT) for supplying a current to a light emitting element, wherein one of a drain and a source of said TFT comprises a potential difference of an unknown magnitude from a ground potential, wherein said TFT is adapted to operate in (i) a linear region where a drain current varies substantially linearly with voltages between said drain and said source of said TFT, and (ii) a saturation region where said drain current varies less than in said linear region, and wherein said inspection device comprises:

a gate voltage application circuit adapted to apply a gate voltage to a gate of said TFT;

a drain voltage application circuit adapted to apply between said drain and said source such a voltage so as to cause said TFT to operate in said saturation region;

a measurement unit adapted to measure a drain current flowing between said drain and said source of said TFT for each of at least two gate voltages applied by said gate voltage application circuit; and a calculation unit operatively connected to said measurement unit and adapted to calculate a threshold voltage that is a threshold of a potential difference between said gate and said source of said TFT necessary to allow a current to flow between said drain and said source of said TFT based on the measured drain current and a value β that is a parameter indicating a level of current supply between said drain and said source of said TFT, wherein said source of said TFT comprises said potential difference of an unknown and variable magnitude from said ground potential, and wherein when said calculation unit has calculated said value β, then:
said drain voltage application circuit is adapted to sequentially apply to said drain of said TFT at least two voltages such as to cause said TFT to operate in said linear region, and said measurement unit is adapted to measure a drain current flowing between said drain and said source of said TFT for each of said voltages sequentially applied by said drain voltage application circuit.

* * * * *